US009496213B2

(12) United States Patent
Kidwell, Jr. et al.

(10) Patent No.: US 9,496,213 B2
(45) Date of Patent: Nov. 15, 2016

(54) INTEGRATED DEVICE PACKAGE COMPRISING A MAGNETIC CORE INDUCTOR WITH PROTECTIVE RING EMBEDDED IN A PACKAGE SUBSTRATE

(71) Applicant: QUALCOMM Incorporated, San Diego, CA (US)

(72) Inventors: Donald William Kidwell, Jr., Campbell, CA (US);
(Continued)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/836,733

(22) Filed: Aug. 26, 2015

(65) Prior Publication Data

US 2016/0233153 A1    Aug. 11, 2016

Related U.S. Application Data

(60) Provisional application No. 62/112,527, filed on Feb. 5, 2015.

(51) Int. Cl.
*H01L 27/08* (2006.01)
*H01L 23/498* (2006.01)
(Continued)

(52) U.S. Cl.
CPC ..... *H01L 23/49838* (2013.01); *H01F 17/0033* (2013.01); *H01L 21/4846* (2013.01);
(Continued)

(58) Field of Classification Search
CPC ............. H01L 21/768; H01L 23/49838; H01L 23/50; H01L 28/10; H01L 23/5227; H01L 17/0033
(Continued)

(56) References Cited

U.S. PATENT DOCUMENTS 6,037,649 A    3/2000 Liou
6,303,971 B1  10/2001 Rhee
(Continued)

FOREIGN PATENT DOCUMENTS

| CN | 103050265 A | 4/2013 |
| EP | 0851439 A1 | 7/1998 |
| WO | WO-2010065113 A1 | 6/2010 |

OTHER PUBLICATIONS

International Search Report and Written Opinion—PCT/US2016/016458—ISA/EPO—May 6, 2016.

*Primary Examiner* — Sonya D McCall Shepard
(74) *Attorney, Agent, or Firm* — Loza & Loza, LLP

(57) ABSTRACT

An integrated device package includes a die and a package substrate. The package substrate includes at least one dielectric layer (e.g., core layer, prepeg layer), a magnetic core in the dielectric layer, a first plurality of interconnects configured to operate as a first protective ring, and a second plurality of interconnects configured to operate as a first inductor. The second plurality of interconnects is positioned in the package substrate to at least partially surround the magnetic core. At least one interconnect from the second plurality of interconnects is also part of the first plurality of interconnects. In some implementations, the first protective ring is a non-contiguous protective ring. In some implementations, the first inductor is a solenoid inductor. In some implementations, the magnetic core includes a carrier, a first magnetic layer, and a second magnetic layer.

30 Claims, 17 Drawing Sheets

(72) Inventors: Ravindra Shenoy, Dublin, CA (US); Mete Erturk, San Diego, CA (US); Layal Rouhana, San Diego, CA (US)

(51) Int. Cl.
| | |
|---|---|
| *H01F 17/00* | (2006.01) |
| *H01L 21/48* | (2006.01) |
| *H01L 23/522* | (2006.01) |
| *H01L 23/58* | (2006.01) |
| *H01L 49/02* | (2006.01) |
| *B23K 26/06* | (2014.01) |
| *H01L 23/50* | (2006.01) |

(52) U.S. Cl.
CPC ..... *H01L 21/4857* (2013.01); *H01L 23/49822* (2013.01); *H01L 23/5226* (2013.01); *H01L 23/5227* (2013.01); *H01L 23/585* (2013.01); *H01L 28/10* (2013.01); *B23K 26/0661* (2013.01); *H01L 23/50* (2013.01)

(58) Field of Classification Search
USPC .................................. 257/531, 713
See application file for complete search history.

(56) References Cited

U.S. PATENT DOCUMENTS

| | | | |
|---|---|---|---|
| 6,531,945 | B1 | 3/2003 | Ahn et al. |
| 6,995,450 | B2 | 2/2006 | Yamamoto |
| 8,253,523 | B2 | 8/2012 | Lee |
| 8,470,612 | B2* | 6/2013 | Hofmann ............... H01F 41/046 257/531 |
| 2006/0227518 | A1 | 10/2006 | Nishio et al. |
| 2014/0356635 | A1 | 12/2014 | Kim |
| 2015/0279545 | A1* | 10/2015 | Fazelpour ......... H01L 23/49822 336/192 |

\* cited by examiner

ANGLED VIEW

PLAN VIEW

PLAN VIEW

INTEGRATED DEVICE PACKAGE COMPRISING A MAGNETIC CORE INDUCTOR WITH PROTECTIVE RING EMBEDDED IN A PACKAGE SUBSTRATE

CLAIM OF PRIORITY/CLAIM OF BENEFIT

The present application claims priority to U.S. Provisional Application No. 62/112,527 titled "Integrated Device Package Comprising A Magnetic Core Inductor With Protective Ring Embedded in a Package Substrate", filed Feb. 5, 2015, which is hereby expressly incorporated by reference herein.

BACKGROUND

1. Field

Various features relate generally to an integrated device package, and more specifically to an integrated device package that includes a magnetic core inductor with protective ring embedded in a package substrate.

2. Background

FIG. 1 illustrates a configuration of an integrated device package that includes a die. Specifically, FIG. 1 illustrates an integrated device package 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through a first plurality of solder balls 112. The package substrate 106 is coupled to a printed circuit board (PCB) 108 through a second plurality of solder balls 116. FIG. 1 illustrates that an inductor 120 is mounted on the PCB 108. The inductor 120 is located externally of the integrated device package 100, and takes up a lot real estate on the PCB 108.

One drawback of the inductor 120 shown in FIG. 1 is that it creates a device with a form factor that may be too large for the needs of mobile computing devices and/or wearable computing devices. This may result in a device that is either too large and/or too thick. That is, the combination of the integrated device package 100, the inductor 120 and the PCB 108 shown in FIG. 1 may be too thick and/or have a surface area that is too large to meet the needs and/or requirements of mobile computing devices and/or wearable computing devices.

Therefore, there is a need for an integrated device package with a better form factor, while at the same time meeting the needs and/or requirements of mobile computing devices and/or wearable computing devices.

SUMMARY

Various features relate to an integrated device package that includes a magnetic core inductor with protective ring embedded in a package substrate.

One example provides integrated device package that includes a die and a package substrate coupled to the die. The package substrate includes at least one dielectric layer, a magnetic core in the dielectric layer, a first protective ring, and a first inductor that includes a plurality of first interconnects. The first inductor is positioned in the package substrate to at least partially surround the magnetic core. The first protective ring comprises at least one interconnect from the plurality of first interconnects of the first inductor.

Another example provides a method for fabricating an integrated device package. The method forms a package substrate, where forming the package substrate includes forming at least one dielectric layer, providing a magnetic core in the dielectric layer, forming a first metal layer to define a first protective ring in the package substrate, and forming a plurality of first interconnects to define a first inductor in the package substrate. The forming of the plurality of first interconnects includes forming the plurality of first interconnects in the package substrate such that the plurality of first interconnects at least partially surrounds the magnetic core, and using at least a portion of the first metal layer, to form an interconnect from the plurality of first interconnects, to define the first inductor. The method couples the package substrate to a die.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device package that includes a die and a package substrate. The die is coupled to (e.g., mounted on) the package substrate. The package substrate includes at least one dielectric layer (e.g., core layer, prepeg layer), a magnetic core in the dielectric layer, a first protective ring, and a first inductor comprising a plurality of first interconnects. The first inductor is positioned in the package substrate to at least partially surround the magnetic core, where at least one interconnect from the plurality of first interconnects is part of the first protective ring. In some implementations, the first protective ring is a discrete protective ring (e.g., non-contiguous protective ring). In some implementations, the first inductor is a solenoid inductor. In some implementations, the package substrate includes a second plurality of interconnects configured to operate as a second inductor. In some implementations, the first inductor and the second inductor are configured to operate as a coupled inductor. In some implementations, the first inductor and the second inductor are configured to operate as a transformer. In some implementations, the magnetic core includes a carrier, a first magnetic layer, and a second magnetic layer.

Figure 1:
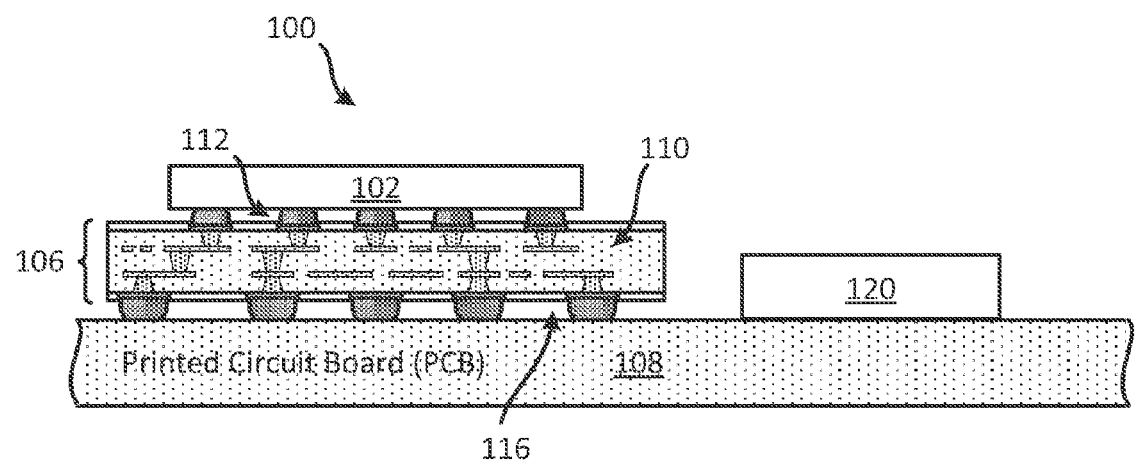
FIG. 1 illustrates an integrated device package.
Figure 2:
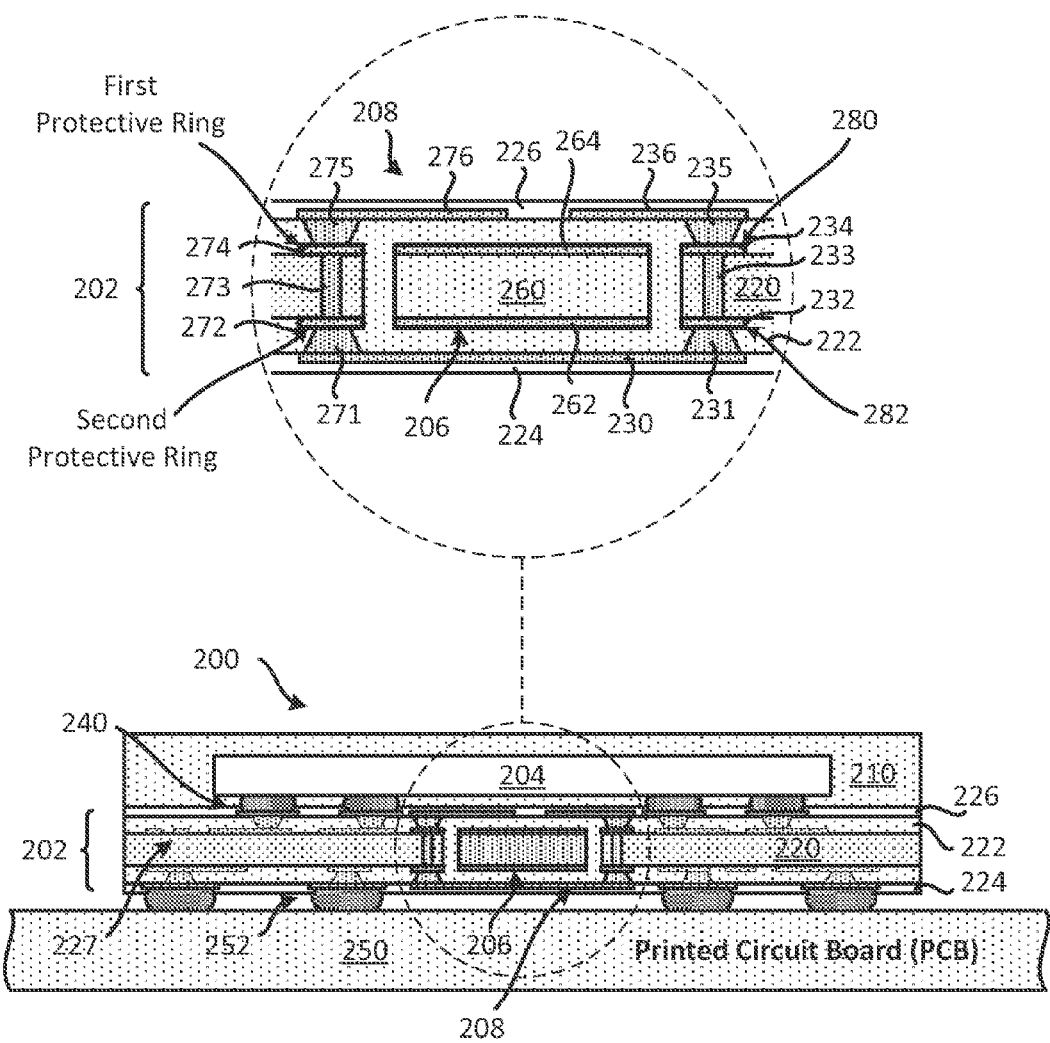
FIG. 2 illustrates a profile view of an example of an integrated device package that includes a magnetic core inductor with protective ring(s) embedded in a package substrate.

Exemplary Integrated Device Package Comprising a Magnetic Core Inductor Embedded in a Package Substrate FIG. 2 illustrates an example of an integrated device package that includes a magnetic core inductor with protective ring(s) embedded in a package substrate. Specifically, FIG. 2 illustrates an example of an integrated device package 200 that includes a substrate 202, a die 204, a magnetic core 206, an inductor 208, an encapsulation layer 210, a first protective ring 280, and a second protective ring 282. The integrated device package 200 is mounted on a printed circuit board (PCB) 250. The die 204 may be an integrated circuit (IC) that includes several transistors and/or other electronic components. The die 204 may be a logic die and/or a memory die.

The substrate 202 may be a package substrate and/or an interposer. The die 204 is coupled (e.g., mounted) to the substrate 202. More specifically, the die 204 is coupled to the substrate 202 through a first plurality of solder balls 240. In some implementations, the die 204 may be coupled to the substrate 202 differently.

The substrate 202 includes a first dielectric layer 220, a second dielectric layer 222, a first solder resist layer 224, a second solder resist layer 226, and several interconnects 227. The first dielectric layer 220 may be a core layer. In some implementations, the first dielectric layer 220 may be a prepeg layer. The second dielectric layer 222 may one or more dielectric layers (e.g., one or more prepeg layers). The interconnects 227 may include traces, pads and/or vias, that are formed in the first dielectric layer 220 and/or the second dielectric layer 222. The first solder resist layer 224 is formed on a first surface (e.g., bottom surface, surface facing the PCB 250) of the substrate 202. The second solder resist layer 226 is formed on a second surface (e.g., top surface, surface facing the die 204) of the substrate 202.

As shown in FIG. 2, the magnetic core 206 is embedded in the substrate 202. More specifically, the magnetic core 206 is located in a cavity of the first dielectric layer 220 (e.g., core layer). The cavity of the first dielectric layer 220 is filled with the second dielectric layer 222 (e.g., prepeg layer). Thus, in the example of FIG. 2, the magnetic core 206 is surrounded by the second dielectric layer 222.

The magnetic core 206 includes a carrier 260, a first magnetic layer 262, and a second magnetic layer 264. The first magnetic layer 262 is formed in a first surface (e.g., bottom surface) of the carrier 260, and the second magnetic layer 264 is formed on a second surface (e.g., top surface) of the carrier 260. In some implementations, the first magnetic layer 262 and the second magnetic layer 264 are magnetic films. The carrier 260 may be substrate configured to provide a base for the first magnetic layer 262 and the second magnetic layer 264. In some implementations, the magnetic core 206 may be made entirely of a magnetic material and/or a magnetic layer. The magnetic core 206 is at least partially surrounded by the inductor 208.

The inductor 208 is at least partially embedded in the substrate 202. The inductor 208 is formed in the substrate 202 such that the inductor 208 at least partially surrounds the magnetic core 206. In some implementations, the magnetic core 206 helps increase the inductance of the inductor 208 (e.g., increases inductance by a factor of about 2× or more), and helps provide an inductor with a high quality (Q) factor, and low resistance. Examples of a magnetic core in an inductor are further described and illustrated below in at least FIGS. 5-6.

In some implementations, the inductor 208 is a solenoid inductor. The inductor 208 includes one or more windings, a first terminal and a second terminal. The one or more windings and terminals of the inductor 208 may be defined by interconnects in the substrate 202. In some implementations, the substrate 202 may include more than one inductor (e.g., first inductor, second inductor). These two or more inductors may be configured to operate as a coupled inductor or a transformer. Examples of more than one inductor in a substrate are further described and illustrated below in at least FIGS. 10-12.

As shown in FIG. 2, the inductor 208 (e.g., first inductor) includes a first interconnect 230, a second interconnect 231, a third interconnect 232, a fourth interconnect 233, a fifth interconnect 234, a sixth interconnect 235, a seventh interconnect 236, an eighth interconnect 271, a ninth interconnect 272, a tenth interconnect 273, an eleventh interconnect 274, a twelfth interconnect 275, and a thirteenth interconnect 276. In some implementations, the first interconnect 230, the second interconnect 231, the third interconnect 232, the fourth interconnect 233, the fifth interconnect 234, the sixth interconnect 235, the seventh interconnect 236, the eighth interconnect 271, the ninth interconnect 272, the tenth interconnect 273, the eleventh interconnect 274, the twelfth interconnect 275, and the thirteenth interconnect 276 are part of a plurality of first interconnects that define the inductor 208.

An interconnect is an element or component of a device (e.g., integrated device, integrated device package, die) and/or a base (e.g., package substrate, printed circuit board, interposer) that may allow or facilitate an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material (e.g., metal, copper) that may provide an electrical path for a signal (e.g., data signal, ground signal, power signal). An interconnect may include more than one element/component. A set of interconnects may include one or more interconnects.

The interconnects 230, 236 and 276 may be traces. The interconnects 231, 233, 235, 271, 273, and 275 may be vias. The interconnects 232, 234, 272, and 274 may be pads. In some implementations, the interconnects 230-236 and 271-276 may define one or more windings of the inductor 208. The windings of an inductor are further described and illustrated below in at least FIGS. 3 and 5-6.

In some implementations, some of the interconnects that define the inductor 208 may also define one or more protective rings (e.g., metal rings) around a cavity in the first dielectric layer 220 (e.g., core layer). In some implementations the first protective ring 280 is defined by metal on a first metal layer in the package substrate. For example, the first protective ring 280 may include the interconnect 234 and the interconnect 274. In some implementations, the second protective ring 282 is defined by metal on a second metal layer in the package substrate. For example, the second protective ring 282 may include the interconnect 232 and the interconnect 272. Thus, in some implementations, the interconnect 232, the interconnect 234, the interconnect 272, and the interconnect 274 may define at least portions of the inductor 208 and at least portions of the protective rings (e.g., first protective ring 280, second protective ring 282).

Protective ring(s) are used to ensure that a proper sized cavity is formed in the first dielectric layer 220. As mentioned above, the cavity is where the magnetic core 206 is placed. The cavity is then subsequently filled with the second dielectric layer 222 (e.g., prepeg layer). A laser is used to create the cavity in the first dielectric layer 220. Because of the Gaussian property of a laser, a protective ring is formed on the first dielectric layer 220 to ensure a precise cut or removal of the first dielectric layer 220. Without standalone protective ring(s) (which is more resistant to the laser than the first dielectric layer 220), unintended portions of the first dielectric layer 220 may be removed, resulting in cavity that is too large and/or oddly shaped. A standalone protective ring is a ring that is not in contact (e.g., not electrically in contact) with an inductor. However, the presence of standalone protective ring(s) can affect the overall performance of the inductor 208. First, the presence of the protective ring(s) may provide shielding effect and eddy currents that reduce the overall inductance and Q factor of the inductor 208. Second, the protective ring(s) may limit the size of the magnetic core 206 that is positioned inside the windings of the inductor 208, since the protective ring(s) takes up space that could otherwise be used by a larger magnetic core. A smaller size magnetic core 206 will provide a smaller inductance boost than a larger size a magnetic core 206.

To reduce and/or eliminate the above negative effects and properties of the standalone protective ring(s), the protective rings are integrated onto the inductor 208. That is, some or all of the metal (e.g., interconnects) that define the protective rings(s) are formed such that they are in contact (e.g., physically in contact, electrically in contact) with interconnects that define the inductor 208. Thus, some interconnects in the substrate 202 serve both as a protective ring and an inductor. A protective ring that is integrated into an inductor may be referred to as an integrated inductor protective ring. This design reduces, minimizes and/or eliminates eddy currents, shielding effects, which increases inductance and Q factor. Moreover, this design provides more space for a larger magnetic core 206 to be placed in the windings of the inductor 208. Examples of protective rings integrated with an inductor are further described and illustrated below in at least FIGS. 5-6.

The encapsulation layer 210 at least partially encapsulates the die 204. The encapsulation layer 210 may include one of at least a mold and/or an epoxy fill. In some implementations, the encapsulation layer 210 may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask).

As mentioned above, FIG. 2 further illustrates that the integrated device package 200 is coupled (e.g., mounted) on the printed circuit board (PCB) 250 through a second plurality of solder balls 252. More specifically, the substrate 202 of the integrated device package 200 is coupled to the PCB 250 through the second plurality of solder balls 252. In some implementations, the integrated device package 200 may be coupled to the PCB 250 differently.

Figure 3:
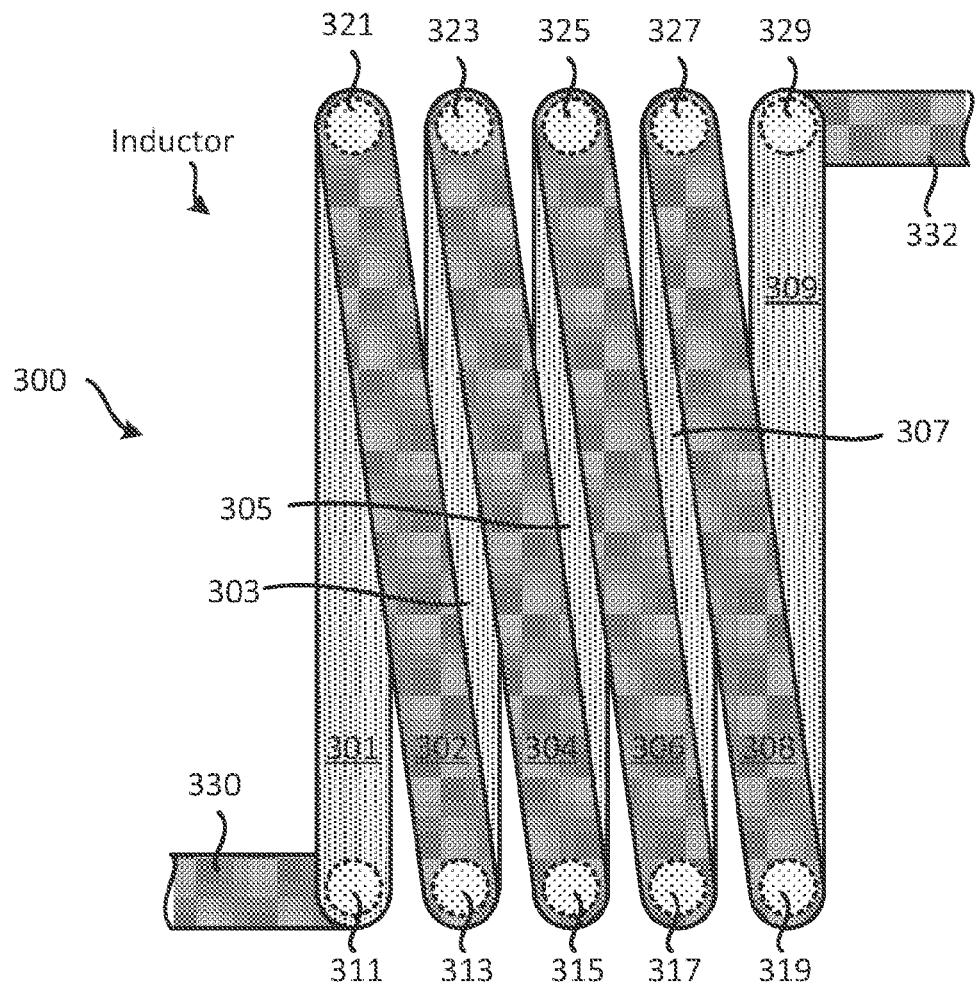
FIG. 3 illustrates a plan view (e.g., top view) of an inductor.

FIG. 3 illustrates a plan view (e.g., top view) of an inductor 300. The inductor 300 may be at least partially embedded in a substrate (e.g., package substrate). In some implementations, the inductor 300 may correspond to the inductor 208 of FIG. 2. The inductor 300 may be a solenoid inductor.

The inductor 300 includes a first interconnect 301, a second interconnect 302, a third interconnect 303, a fourth interconnect 304, a fifth interconnect 305, a sixth interconnect 306, a seventh interconnect 307, a eighth interconnect 308, and a ninth interconnect 309. The first interconnect 301 (e.g., trace), the third interconnect 303, the fifth interconnect 305, the seventh interconnect 307, and the ninth interconnect 309 are formed on a first metal layer of a substrate (e.g., substrate 202). For example, the third interconnect 303 may correspond to the interconnect 230 of FIG. 2. The second interconnect 302 (e.g., trace), the fourth interconnect 304, the sixth interconnect 306, and the eighth interconnect 308 are formed in a second metal layer of a substrate (e.g., substrate 202). For example, the second interconnect 302 may correspond to the interconnect 236 of FIG. 2.

The inductor 300 further includes a plurality of interconnects 311, a plurality of interconnects 313, a plurality of interconnects 315, a plurality of interconnects 317, a plurality of interconnects 319, a plurality of interconnects 321, a plurality of interconnects 323, a plurality of interconnects 325, a plurality of interconnects 327, and a plurality of interconnects 329. A plurality of interconnects may include one or more interconnects. For example, a plurality of interconnects may include one or more pads and/or one or more vias. In some implementations, the above plurality of interconnects 311, 313, 315, 317, 319, 321, 323, 325, 327, and/or 329 vertically traverse a substrate (e.g., substrate 202). For example, the plurality of interconnects 313 may collectively represent the interconnects 231-235 of FIG. 2. In another example, the plurality of interconnects 323 may collectively represent the interconnects 271-275 of FIG. 2.

As shown in FIG. 3, the plurality of interconnects 311 is coupled (e.g., electrically coupled) to the interconnect 301. The interconnect 301 is coupled (e.g., electrically coupled) to the plurality of interconnects 321. The plurality of interconnects 321 is coupled to the interconnect 302. The interconnect 302 is coupled to the plurality of interconnects 313. The plurality of interconnects 313 is coupled to the interconnect 303. The interconnect 303 is coupled to the plurality of interconnects 323. The plurality of interconnects 323 is coupled to the interconnect 304. The interconnect 304 is coupled to the plurality of interconnects 315. The plurality of interconnects 315 is coupled to the interconnect 305. The interconnect 305 is coupled to the plurality of interconnects 325. The plurality of interconnects 325 is coupled to the interconnect 306. The interconnect 306 is coupled to the plurality of interconnects 317. The plurality of interconnects 317 is coupled to the interconnect 307. The interconnect 307 is coupled to the plurality of interconnects 327. The plurality of interconnects 327 is coupled to the interconnect 308. The interconnect 308 is coupled to the plurality of interconnects 319. The plurality of interconnects 319 is coupled to the interconnect 309. The interconnect 309 is coupled to the plurality of interconnects 329.

The inductor 300 includes one or more windings. Different implementations of the inductor 300 may include different number of windings. In some implementations, the windings of the inductor 300 are defined by the first interconnect 301, the second interconnect 302, the third interconnect 303, the fourth interconnect 304, the fifth interconnect 305, the sixth interconnect 306, the seventh interconnect 307, the eighth interconnect 308, the ninth interconnect 309, the plurality of interconnects 311, the plurality of interconnects 313, the plurality of interconnects 315, the plurality of interconnects 317, the plurality of interconnects 319, the plurality of interconnects 321, the plurality of interconnects 323, the plurality of interconnects 325, the plurality of interconnects 327, and the plurality of interconnects 329. For example, a first winding of the inductor 300 may be defined by the interconnect 302, the plurality of interconnects 313, the interconnect 303 and the plurality of interconnects 323. However, different implementations may define a winding of the inductor 300 differently.

FIG. 3 also illustrates an interconnect 330 and an interconnect 332. The interconnect 330 may represent a first terminal of the inductor 300. The interconnect 330 is coupled to the plurality of interconnects 311. The interconnect 332 may represent a second terminal of the inductor 300. The interconnect 332 is coupled to the plurality of interconnects 329. The plurality of interconnects 311 and 329 may be optional. In some implementations, the interconnect 330 is directly coupled to the interconnect 301. In some implementations, the interconnect 332 is directly coupled to the interconnect 309.

Figure 4:
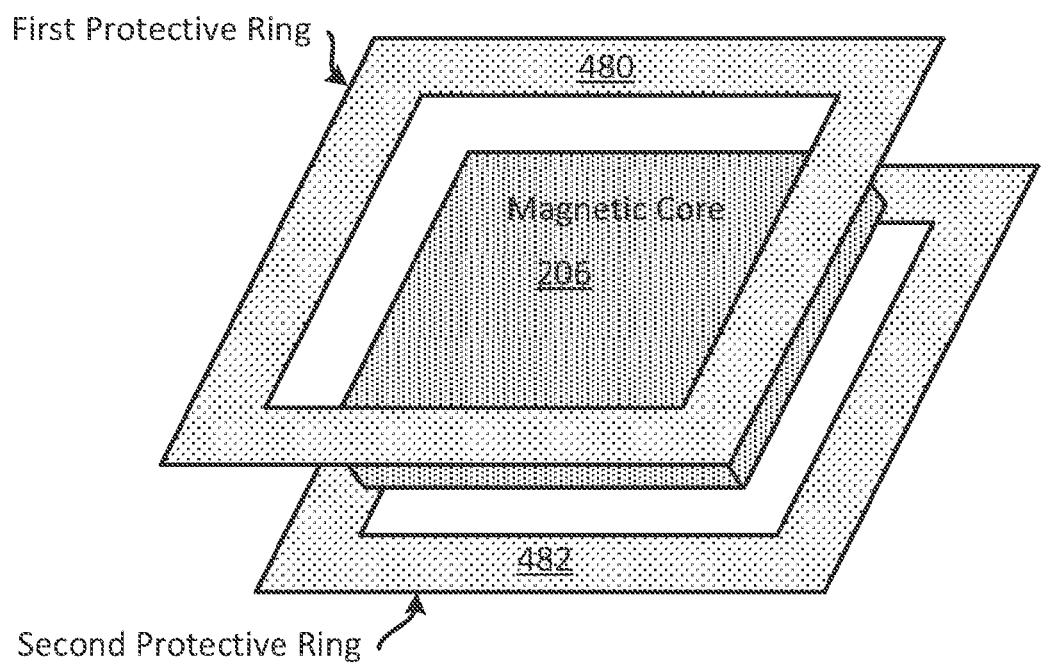
FIG. 4 illustrates an angled view of a magnetic core and protective rings.

FIG. 4 illustrates an angled assembly view of a magnetic core 206, a first protective ring 480, and a second protective ring 482. The magnetic core 206, the first protective ring 480, and the second protective ring 482 are embedded in a substrate (e.g., substrate 202). For purpose of clarity, the substrate and the dielectric layers (e.g., core layer, prepeg layers) are not shown in FIG. 4

The first protective ring 480 is a metal layer formed on a first surface (e.g., top surface) of a first dielectric layer (e.g., core layer) of a substrate. The second protective ring 482 is metal layer formed on a second surface (e.g., bottom surface) of the first dielectric layer of the substrate. The first protective ring 480 and/or the second protective ring 482 form the perimeter or periphery of a cavity in the first dielectric layer. As an example, the first protective ring 480 may be defined by a first metal layer in a package substrate (e.g., the interconnect 234 and the interconnect 274 of FIG. 2). The first protective ring 480 may correspond to the first protective ring 280. Similarly, as an example, the second protective ring 482 may be defined by a second metal layer in a package substrate (e.g., the interconnect 232 and the interconnect 272 of FIG. 2.) The second protective ring 482 may correspond to the second protective ring 282. Different implementations may have different designs for the protective rings. For example, a protective ring may be circular, rectangular, shape, or any other shapes. The protective rings may be located on different layers and/or levels of a package substrate. For example, the first protective ring 480 may be located on a first metal layer of a package substrate, and the second protective ring 482 may be located on a second metal layer of a package substrate. Referring back to FIG. 2, in some implementations, the first metal layer may be on the same metal layer as the interconnect 274, and the second metal layer may be on the same metal layer as the interconnect 272. In some implementations, one or more protective ring may be a discrete protective ring (e.g., non-contiguous protective ring) that is defined by several metal layers (e.g., several interconnects). An example of a discrete protective ring is further described in FIG. 6.

The magnetic core 206 is positioned in the cavity of the dielectric layer that is defined by the first protective ring 480 and/or the second protective ring 482. In some implementations, the magnetic core 206 may be at least partially surrounded by the first protective ring 480 and/or the second protective ring 482.

Figure 5:
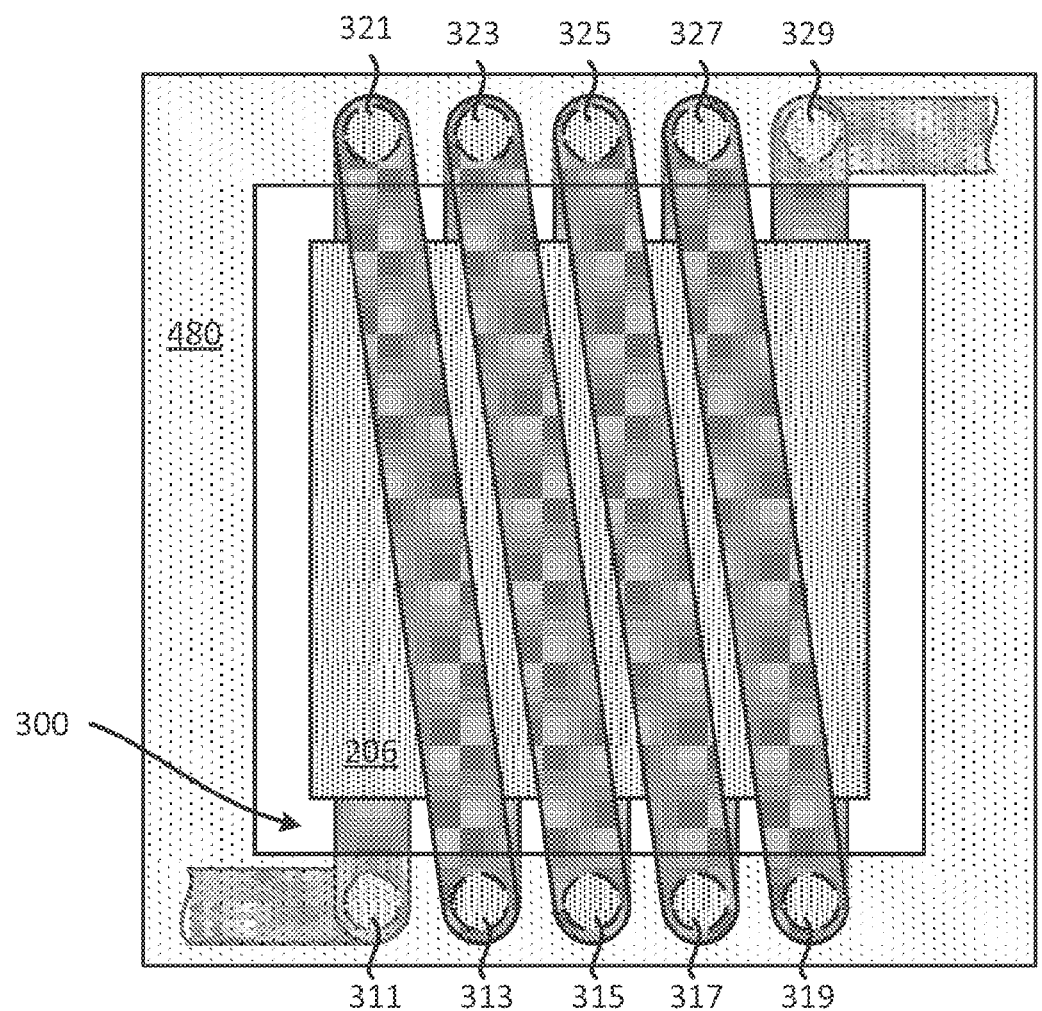
FIG. 5 illustrates a plan view (e.g., top view) of a magnetic core, an inductor, and a protective ring.

FIG. 5 illustrates the integration of the inductor 300 of FIG. 3 with the magnetic core 206 and the first protective ring 480 of FIG. 4. The inductor 300, the magnetic core 206 and the first protective ring 480 may be implemented in a substrate (e.g., substrate 202). However, for the purpose of clarity, the substrate, including the dielectric layers (e.g., core layer, prepeg layers) are not shown. As shown in FIG. 5, the inductor 300 is integrated with the magnetic core 206 such that the magnetic core 206 is located at least partially within the windings of the inductor 300. In addition, the first protective ring 480 is integrated in the windings of the inductor 300 such that the first protective ring 480 is part of (e.g., touching) the windings of the inductor 300. A second protective ring 482 (which is not shown in FIG. 5) may also be integrated in the windings of the inductor 300. The second protective ring 482 is located on a different metal layer of the substrate.

This design reduces and/or eliminates eddy currents, improved shielding effects, which increases inductance and Q factor. Moreover, this design provides more space for a larger magnetic core to be placed in the windings of the inductor 300.

Different implementations may provide a magnetic core, a protective ring, and an inductor with different dimensions. In some implementations, the magnetic core 206 has a dimension of about at least 760 microns (μm)×770 microns (μm). In some implementations, the edge to edge distance (e.g., spacing) between the magnetic core 206 and the protective ring 480 is about 50 microns (μm) or less. In some implementations, the edge to edge distance (e.g., spacing) between the magnetic core 206 and a winding of the inductor 300 is about 50 microns (μm) or less. In some implementations, the edge to edge distance (e.g., spacing) between a winding of the inductor 300 and the protective ring 480 is about 25 microns (μm) or less.

FIG. 5 shows one protective ring, but some implementations may include more than one protective ring, as described in FIGS. 2 and 4. For example, the protective ring 480 may be located on a first layer (e.g., first metal layer) of the package substrate, and another protective ring (e.g., protective ring 482) may be located on a second layer (e.g., second metal layer) of the package substrate. In some implementations, a protective ring may be patterned and/or segmented. Thus, instead of one contiguous ring, the protective ring is a discrete protective ring defined by several non-contiguous segments and/or non-contiguous portions.

Figure 6:
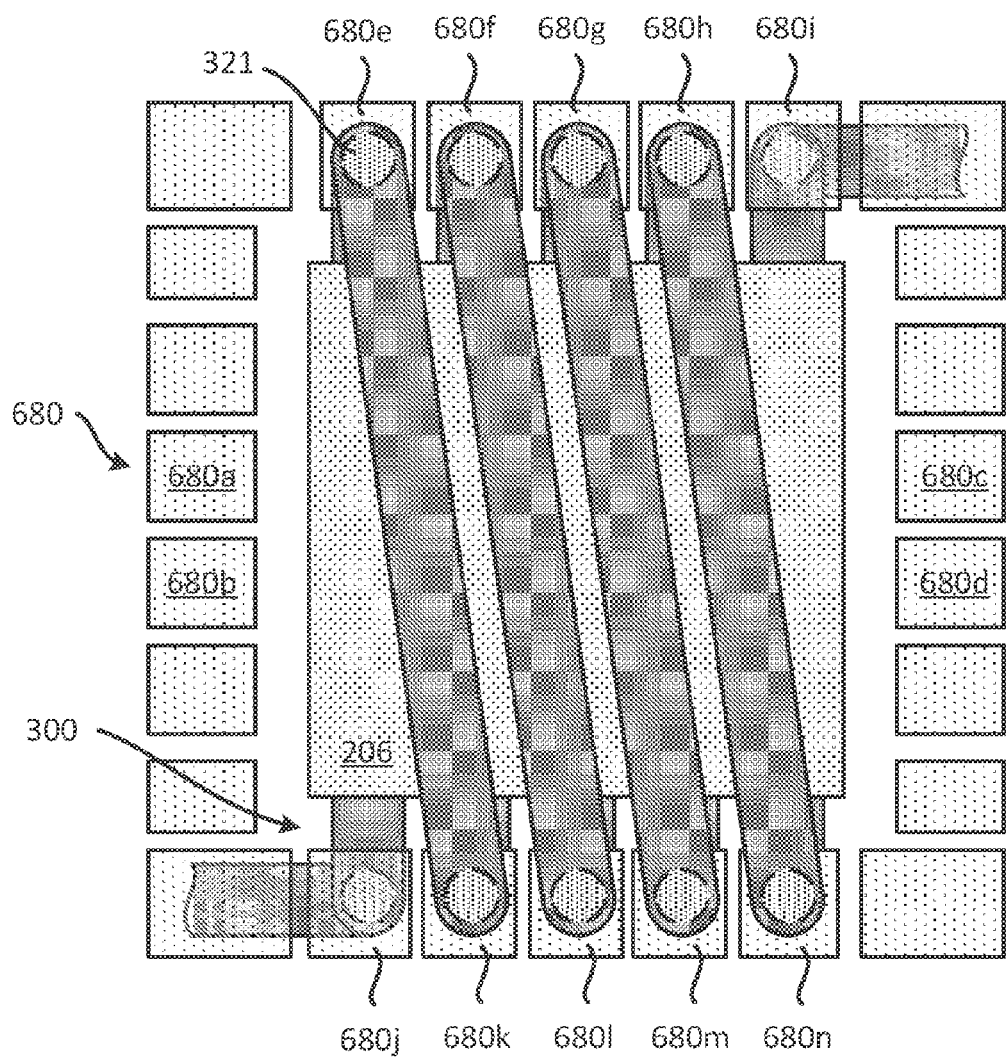
FIG. 6 illustrates a plan view (e.g., top view) of a magnetic core, an inductor, and a discrete protective ring.

FIG. 6 illustrates an example of a discrete protective ring. Specifically, FIG. 6 illustrates a discrete protective ring 680 that is integrated with the magnetic core 206 and the inductor 300. The inductor 300, the magnetic core 206 and the discrete protective ring 680 may be implemented in a substrate (e.g., substrate 202). However, for the purpose of clarity, the substrate, including the dielectric layers (e.g., core layer, prepeg layers) are not shown. The configuration of FIG. 6 is similar to the configuration of FIG. 5, except that the discrete protective ring 680 is non-contiguous.

Only one discrete protective ring (e.g., non-contiguous protective ring) is shown, but some implementations may include more than one discrete protective ring. For example, the discrete protective ring 680 may be located on a first layer (e.g., first metal layer) of the package substrate, and another protective ring may be located on a second layer (e.g., second metal layer) of the package substrate. In addition, some implementations may use a combination of a contiguous protective ring and a discrete protective ring (e.g., non-contiguous protective ring).

The discrete protective ring 680 includes several protective ring portions 680a-n. Some portions of the protective ring 680 may be coupled (e.g., electrically coupled) to portions of the winding of the inductor 300. Thus, some portions of the protective ring 680 may be part of the inductor 300. For example, the protective ring portion 680e is part of the plurality of interconnects 321. In another example, the protective ring portion 680f may be the interconnect 274 of FIG. 2 Thus, some portions of the protective ring 680 may be part of the inductor 300, while other portions of the protective ring 680 are not. For example, the protective ring portion 680a is not directly physically touching the inductor 300.

Compared to a contiguous protective ring, the use of discrete protective ring may provide for better reduction in eddy currents, improved shielding effects, which increases inductance and Q factor. FIG. 6 merely illustrates one example of how a discrete protective ring may be segmented. Different implementations may segment the protective ring differently with different sizes and shapes.

Figure 7:
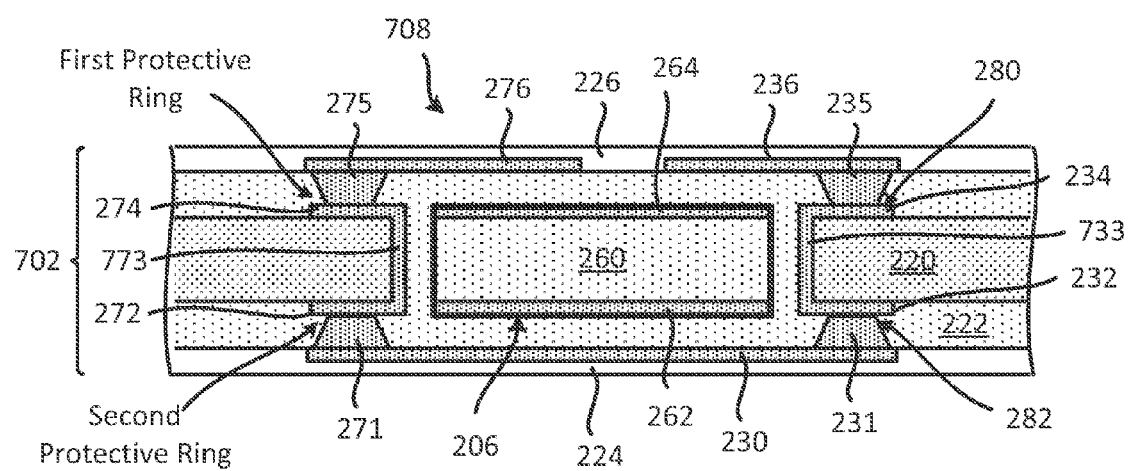
FIG. 7 illustrates a close up profile view of a magnetic core inductor with protective rings embedded in a package substrate.

FIG. 6 illustrates one example of a profile view of an inductor that may be embedded in a substrate. Different implementations may embed an inductor with a different design and/or a configuration. FIG. 7 illustrates a close up view of a substrate 702 that includes the magnetic core 206, a protective ring, and an inductor 708. The substrate 702 is similar to the substrate 202 of FIG. 2, except that the inductor 708 has a different design than the inductor 208 of FIG. 2. As will be described below, the inductor 708 includes an interconnect that is formed on the wall of the cavity that includes the magnetic core 206.

As shown in FIG. 7, the inductor 708 includes the first interconnect 230, the second interconnect 231, the third interconnect 232, a fourth interconnect 733, the fifth interconnect 234, the sixth interconnect 235, the seventh interconnect 236, the eighth interconnect 271, the ninth interconnect 272, a tenth interconnect 773, the eleventh interconnect 274, the twelfth interconnect 275, and the thirteenth interconnect 276. Thus, in this example, the inductor 708 includes different interconnects 733 and 773. The interconnect 733 is coupled to the interconnect 232 and the interconnect 234. The interconnect 773 is coupled to the interconnect 272 and the interconnect 274. The interconnect 733 and the interconnect 773 are defined within the cavity of the first dielectric layer 220. The interconnect 733 and the interconnect 773 are formed on a side portion of the first dielectric layer 220 (e.g., core layer). The interconnect 733 and the interconnect 773 are covered by the second dielectric layer 222 (e.g., prepeg layer). In some implementations, the edge to edge distance (e.g., spacing) between the magnetic core 206 and the interconnect 733 is about 50 microns (μm) or less. In some implementations, the edge to edge distance (e.g., spacing) between the magnetic core 206 and the interconnect 773 is about 50 microns (μm) or less.

In some implementations, some of the interconnects that define the inductor 708 also define one or more protective rings (e.g., metal rings) around a cavity in the first dielectric layer 220 (e.g., core layer). In some implementations a first protective ring 280 is defined by the interconnect 234 and the interconnect 274. In some implementations, a second protective ring 282 is defined by the interconnect 232 and the interconnect 272. Thus, the interconnect 232, the interconnect 234, the interconnect 272, and the interconnect 274 may define at least portions of the inductor 208 and at least portions of the protective rings (e.g., first protective ring 280, second protective ring 282). The protective rings 280 and/or 282 of FIG. 7 may correspond to the protective ring 480 or the protective ring 680.

Figure 8A:
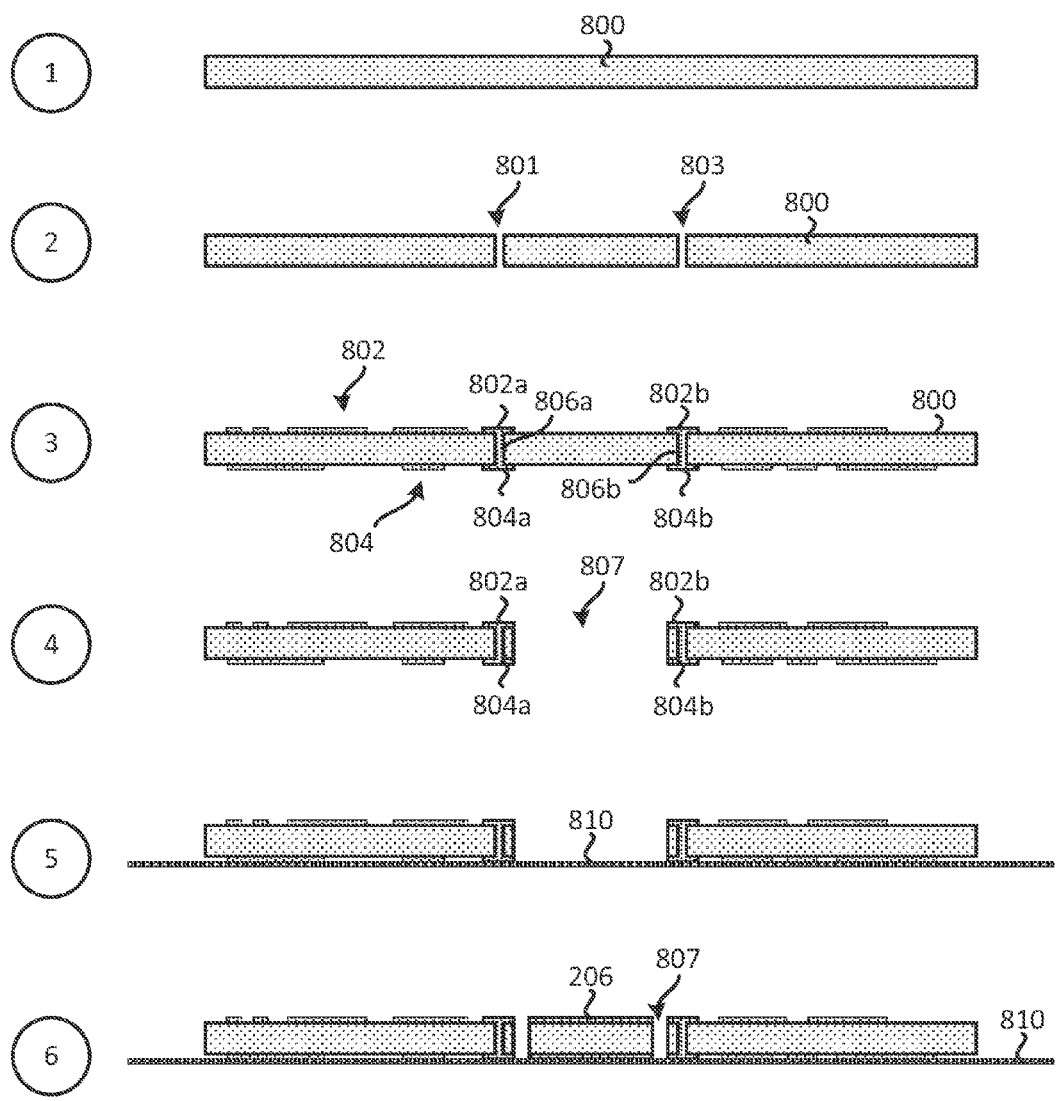
FIG. 8 (which includes FIGS. 8A-8C) illustrates an exemplary sequence for providing/fabricating an integrated device package that includes a magnetic core inductor with protective rings embedded in a package substrate.
Figure 8B:
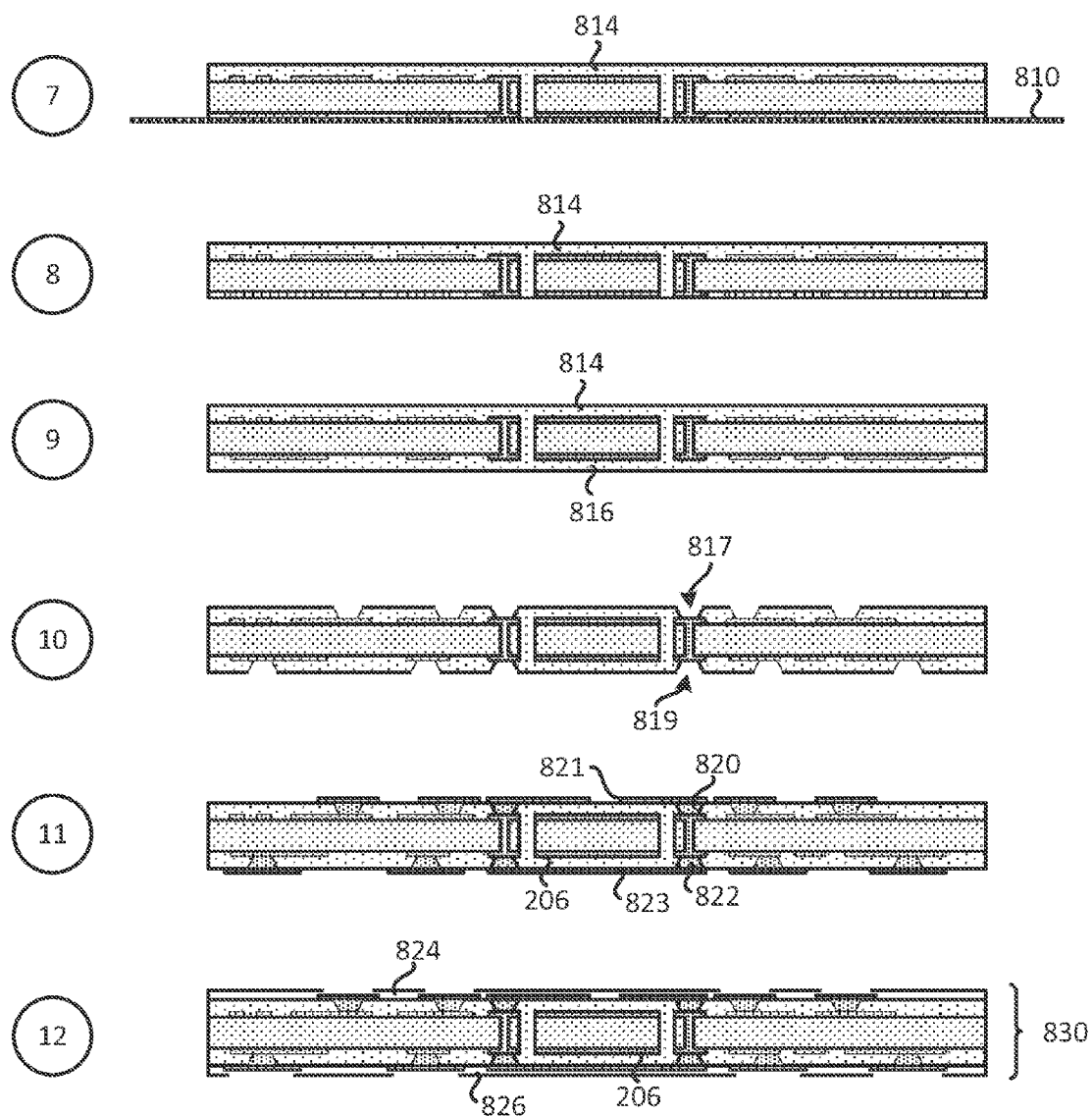
Figure 8C:
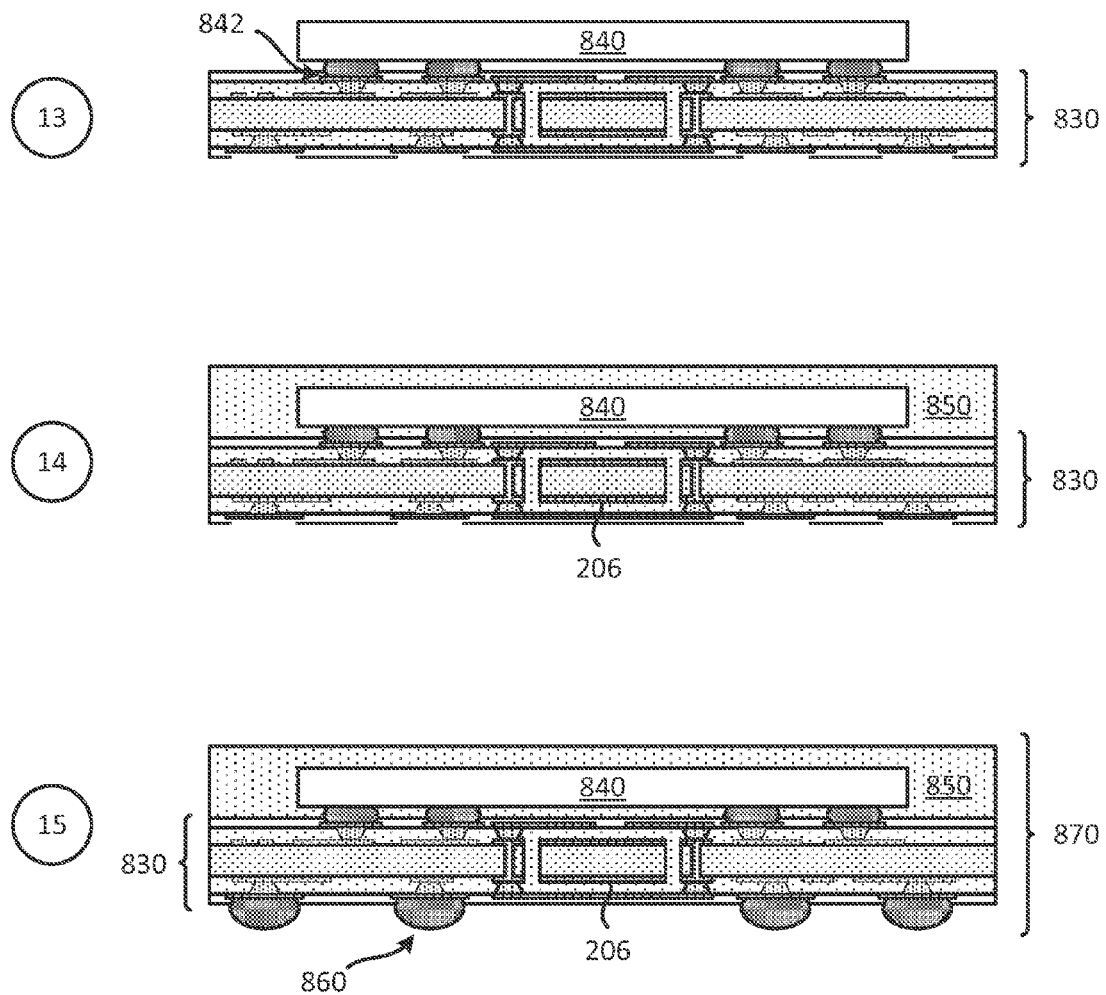

Exemplary Sequence for Fabricating an Integrated Device Package Comprising a Magnetic Core Inductor Embedded in a Package Substrate In some implementations, providing/fabricating an integrated device package that includes a magnetic core inductor with a protective ring embedded in a package substrate includes several processes. FIG. 8 (which includes FIGS. 8A-8C) illustrates an exemplary sequence for providing/fabricating an integrated device package that includes a magnetic core inductor with a protective ring embedded in a package substrate. In some implementations, the sequence of FIGS. 8A-8C may be used to provide/fabricate the integrated device package 200 of FIG. 2 and/or other integrated device packages described in the present disclosure.

It should be noted that the sequence of FIGS. 8A-8C may combine one or more stages in order to simplify and/or clarify the sequence for providing/fabricating an integrated device package that includes a magnetic core inductor with a protective ring embedded in a package substrate. In some implementations, the order of the processes may be changed or modified.

Stage 1, as shown in FIG. 8A, illustrates a state after a dielectric layer 800 is provided. The dielectric layer 800 may be a core layer. In some implementations, the dielectric layer 800 is provided by a supplier. In some implementations, the dielectric layer 800 is fabricated (e.g., formed).

Stage 2 illustrates a state after a first cavity 801 and a second cavity 803 are formed in the dielectric layer 800. Different implementations may form the first cavity 801 and the second cavity 803 differently. In some implementations, a laser process may be used to form the cavities.

Stage 3 illustrates a state after a first metal layer 802 and a second metal layer 804 are formed on the dielectric layer 800. The forming and patterning of the first metal layer 802 and the second metal layer 804 may form an interconnect 802a, an interconnect 802b, an interconnect 804a, interconnects 804b, an interconnect 806a, and an interconnect 806b. The interconnect 802a-b may define a first protective ring (e.g., discrete protective ring) on a first surface of the dielectric layer 800. The interconnects 804a-b may define a second protective ring (e.g., discrete protective ring) on a second surface of the dielectric layer 800. The interconnect 806a (e.g., via) may couple the interconnect 802a and the interconnect 804a. The interconnect 806b (e.g., via) may couple the interconnect 802b and the interconnect 804b. The interconnects 806a-b may be formed from the first metal layer 802, the second metal layer 804, or a combination of the first metal layer 802 and the second metal layer 804. The interconnects 802a-b, 804a-b and 806a-b may define portions of an inductor. Different implementations may use different processes for forming the first metal layer 802 and the second metal layer 804. A photo-lithography process (e.g., photo-etching process) may be use to pattern the metal layers. Various examples of photo-lithography processes are described in FIGS. 13-14. Stage 3 involves patterning the first dielectric layer, including the formation of the integrated inductor protective ring (e.g., discrete protective ring). Patterning methods could include modified semi-additive or semi-additive patterning processes (SAP).

Stage 4 illustrates a state after a cavity 807 is formed in the dielectric layer 800. In some implementations, a laser is used to form (e.g., remove) portions of the dielectric layer 800. The portion of the dielectric layer 800 that is removed by the laser may be defined within an area of the protective ring(s), as defined by the interconnects 802a-b and the interconnects 804a-b.

Stage 5 illustrates a state after the dielectric layer 800 that includes interconnects 802a-b, 804a-b, 806a and 806b, is coupled to a carrier 810.

Stage 6 illustrates a state after a magnetic core 206 is positioned in the cavity 807 of the dielectric layer 800 (e.g., core layer). The magnetic core 206 may be any of the magnetic cores described in the present disclosure. The magnetic core 206 is positioned on the carrier 810.

Stage 7, as shown in FIG. 8B, illustrates a state after a second dielectric layer 814 is formed on a first surface of the dielectric layer 800, the cavity 807 and the magnetic core 206. The second dielectric layer 814 may be prepeg layer.

Stage 8 illustrates a state after the carrier 810 is decoupled (e.g., detached) from the dielectric layer 800.

Stage 9 illustrates a state after a third dielectric layer 816 is formed on a second side of the dielectric layer 800. In some implementations, the third dielectric layer 816 and the second dielectric layer 814 are the same dielectric layer.

Stage 10 illustrates a state after a cavity 817 is formed in the second dielectric layer 814, and a cavity 819 is formed in the third dielectric layer 816. A photo-etching process may be used to form the cavity. Stage 10 involves via cavity formation and patterning for the second and third dielectric layers. Patterning methods could include modified semi-additive or semi-additive patterning processes (SAP).

Stage 11 illustrates a state after an interconnect 820 (e.g., via) and an interconnect 821 (e.g., trace) are formed in/on the dielectric layer 814, and an interconnect 822 (e.g., via) and an interconnect 823 (e.g., trace) are formed in/on the dielectric layer 816. The interconnect 820 is coupled to the interconnect 821 and the interconnect 802b. The interconnect 822 is coupled to the interconnect 823 and the interconnect 804b. The interconnects 823, 822, 804b, 806b, 802b, 820 and 821 may define a portion (e.g., winding) of an inductor.

Stage 12 illustrates a state after a first solder resist layer 824 is formed on the dielectric layer 814, and a second solder resist layer 826 is formed on the dielectric layer 816. Stage 12 illustrates a substrate 830 that includes the dielectric layer 800, the magnetic core 206, the dielectric layer 814, the dielectric layer 816, several interconnects (e.g., interconnect 820), the first solder resist layer 824, and the second solder resist layer 826. The substrate 830 may be a package substrate.

Stage 13, as shown in FIG. 8C, illustrates a state after a die 840 is coupled (e.g., mounted) to the substrate 830 through a plurality of solder balls 842. The die 840 may be coupled to the substrate 830 differently.

Stage 14 illustrates a state after an encapsulation layer 850 is formed on the substrate 830 and the die 840. In some implementations, the encapsulation layer 850 is one of a mold and/or epoxy fill.

Stage 15 illustrates a state after a plurality of solder balls 860 is coupled to the substrate 830. In some implementations, stage 15 illustrates an integrated device package 870 that includes the substrate 830, the magnetic core 206, an inductor, a protective ring, the die 840, and the encapsulation layer 850. In some implementations, the inductor is a solenoid inductor. In some implementations, the integrated device package 870 is similar to the integrated device package 200 of FIG. 2.

Figure 9:
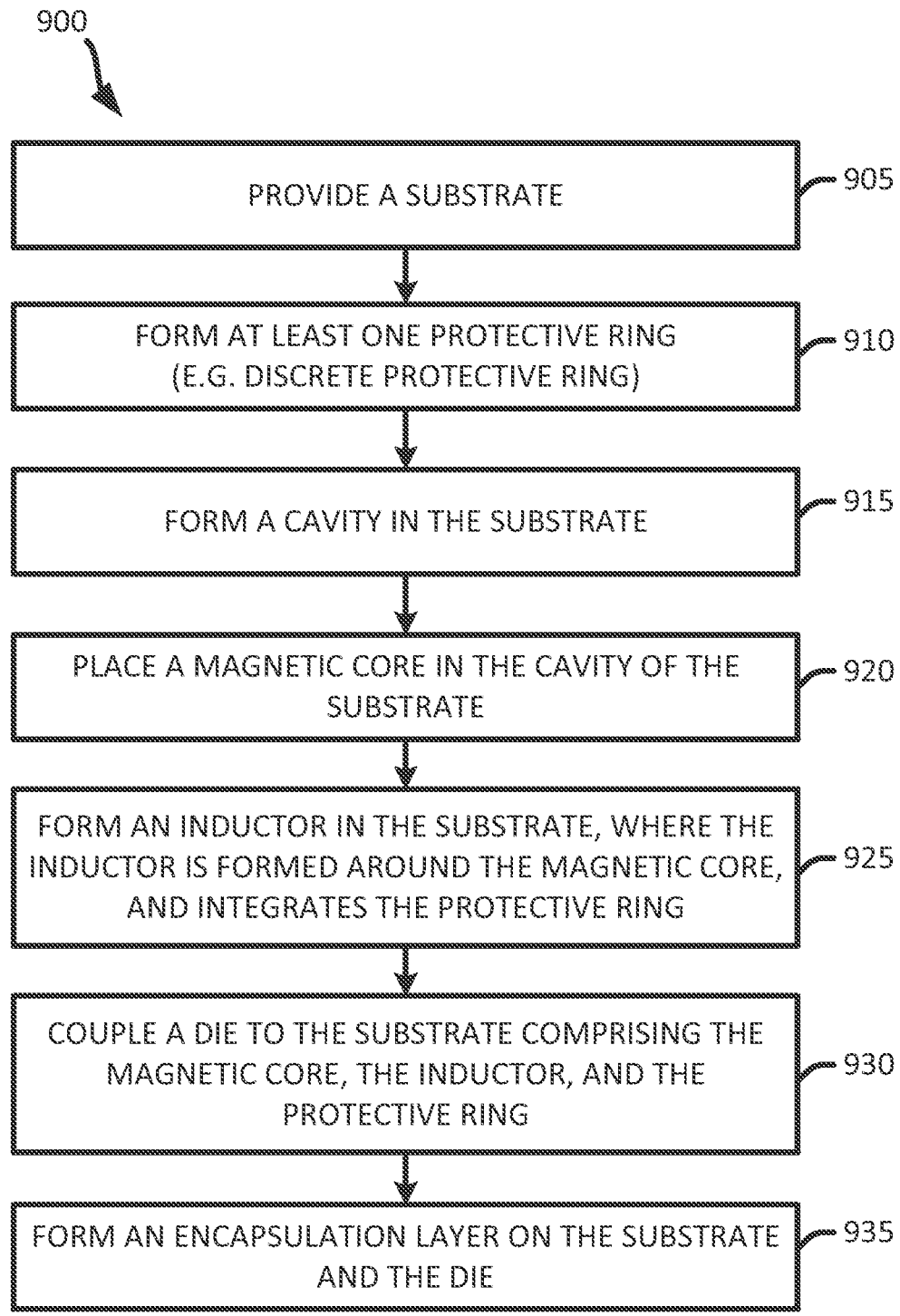
FIG. 9 illustrates an exemplary flow diagram of a method for providing/fabricating an integrated device package that includes a magnetic core inductor with protective rings embedded in a package substrate.

Exemplary Method for Fabricating an Integrated Device Package Comprising a Magnetic Core Inductor Embedded in a Package Substrate FIG. 9 illustrates an exemplary flow diagram of a method 900 for providing/fabricating an integrated device package that includes a magnetic core inductor with a protective ring embedded in a package substrate. In some implementations, the method of FIG. 9 may be used to provide/fabricate the integrated device package of FIG. 9 and/or other integrated device packages in the present disclosure.

It should be noted that the flow diagram of FIG. 9 may combine one or more processes in order to simplify and/or clarify the method for providing an integrated device package. In some implementations, the order of the processes may be changed or modified.

The method provides (at 905) a substrate. In some implementations, the substrate is provided by a supplier. In some implementations, the substrate is fabricated (e.g., formed). The substrate may be a package substrate. The substrate includes a dielectric layer (e.g., core layer) and metal layers on the dielectric layer.

The method forms (at 910) at least one protective ring (e.g., protective ring 480, 482) in/on the substrate. Different implementations may form different protective rings. The protective ring may be a contiguous protective ring or a discrete protective ring (e.g., non-contiguous protective ring). The protective ring may be formed (e.g., through a photo-lithography process) from the metal layers on the dielectric layer of the substrate.

The method forms (at 915) a cavity in the dielectric layer (e.g., core layer) of the substrate. The cavity may be formed in an area or portion of the dielectric layer that is surrounded or defined by the protective ring.

The method places (at 920) a magnetic core in the cavity of the dielectric layer of the substrate. An example of a magnetic core is the magnetic core 206 described in FIG. 2. Stage 6 of FIG. 8A illustrates an example of placing the magnetic core 206 in a cavity of a substrate.

The method forms (at 925) an inductor in the substrate such that the inductor (e.g., inductor 300) is formed at least partially around the magnetic core. The inductor is formed in the substrate such that at least some portions of the protective ring are integrated into the inductor (e.g., integrated into the windings of the inductor, where the protective ring is in contact with the inductor). The inductor may be a solenoid inductor. Stages 10-12 of FIG. 8B illustrate an example of forming an inductor in a substrate.

The method couples (at 930) a die (e.g., die 204) to the substrate that includes the magnetic core, the protective ring, and the inductor. The die may be coupled to the substrate through a plurality of solder balls. Some implementations may couple the die to the substrate differently. Stage 13 of FIG. 8C illustrates an example of a die coupled to a substrate.

The method forms (at 935) an encapsulation layer (e.g., encapsulation layer 210) on the substrate and the die. The encapsulation layer may be a mold and/or an epoxy fill. Stage 14 of FIG. 8C illustrates an example of an encapsulation layer being formed on the substrate and the die. Once the encapsulation is formed, the method may couple a plurality of solder balls to the substrate. The plurality of solder balls may be used to couple the substrate to a printed circuit board (PCB).

Figure 10:
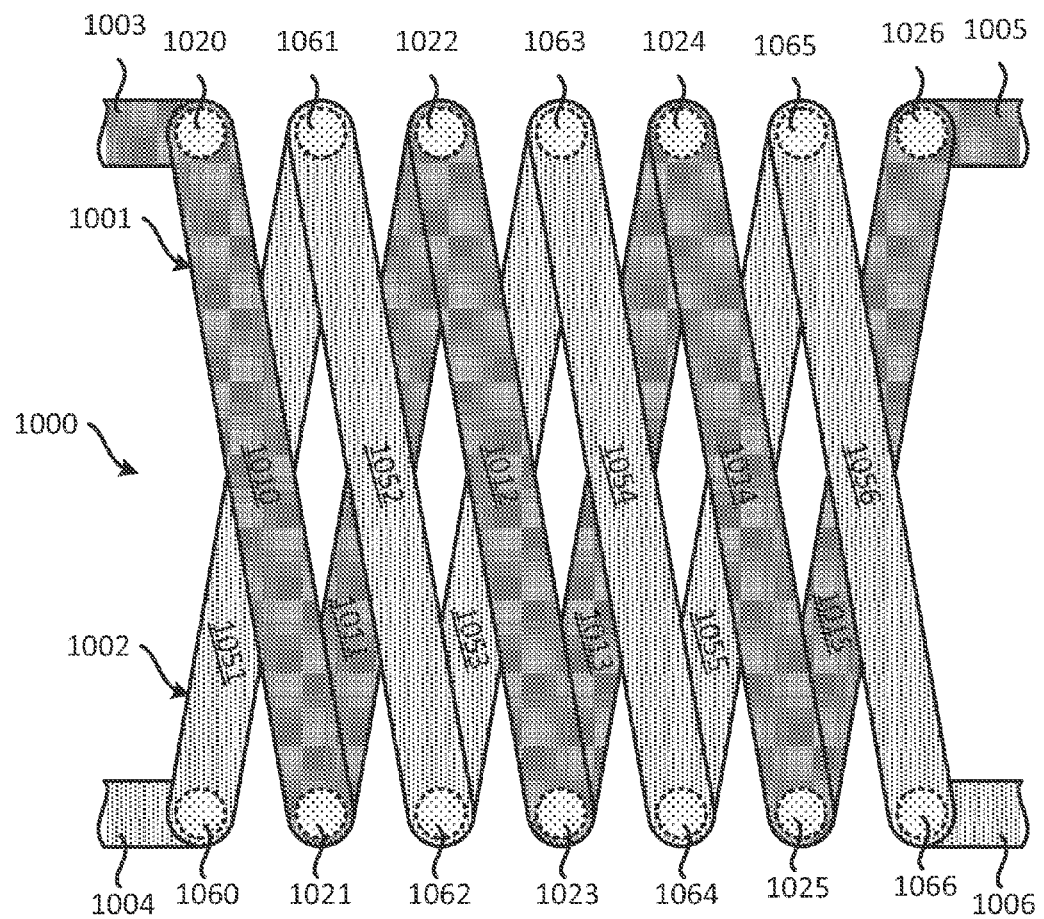
FIG. 10 illustrates a plan view (e.g., top view) of a coupled inductor.

Exemplary Integrated Device Package Comprising Several Magnetic Core Inductors Embedded in a Package Substrate FIG. 10 illustrates a plan view (e.g., top view) of a coupled inductor 1000. The coupled inductor 1000 includes a first inductor 1001 and a second inductor 1002. The coupled inductor 1000 may be at least partially embedded in a substrate (e.g., package substrate) in a similar manner as described in FIG. 2 above. The first inductor 1001 is interleaved with the second inductor 1002. That is, the windings of the first inductor 1001 are interleaved with the windings of the second inductor 1002.

The first inductor 1001 includes a first interconnect 1010, a second interconnect 1011, a third interconnect 1012, a fourth interconnect 1013, a fifth interconnect 1014, and a sixth interconnect 1015. The first interconnect 1010 (e.g., trace), the third interconnect 1112, and the fifth interconnect 1114 are formed on a first metal layer of a substrate (e.g., substrate 202). The second interconnect 1011, the fourth interconnect 1013, and the sixth interconnect 1015 are formed in a second metal layer of a substrate (e.g., substrate 202).

The first inductor 1001 further includes a plurality of interconnects 1020, a plurality of interconnects 1021, a plurality of interconnects 1022, a plurality of interconnects 1023, a plurality of interconnects 1024, a plurality of interconnects 1025, and a plurality of interconnects 1026. A plurality of interconnects may include one or more interconnects. For example, a plurality of interconnects may include one or more pads and/or one or more vias. In some implementations, the above plurality of interconnects 1020-1026 vertically traverse a substrate (e.g., substrate 202). For example, the plurality of interconnects 1021 may collectively represent the interconnects 231-235 of FIG. 2.

As shown in FIG. 10, the plurality of interconnects 1020 is coupled (e.g., electrically coupled) to the interconnect 1010. The interconnect 1010 is coupled (e.g., electrically coupled) to the plurality of interconnects 1021. The plurality of interconnects 1021 is coupled to the interconnect 1011. The interconnect 1011 is coupled to the plurality of interconnects 1022. The plurality of interconnects 1022 is coupled to the interconnect 1012. The interconnect 1012 is coupled to the plurality of interconnects 1023. The plurality of interconnects 1023 is coupled to the interconnect 1013. The interconnect 1013 is coupled to the plurality of interconnects 1024. The plurality of interconnects 1024 is coupled to the interconnect 1014. The interconnect 1014 is coupled to the plurality of interconnects 1025. The plurality of interconnects 1025 is coupled to the interconnect 1015. The interconnect 1015 is coupled to the plurality of interconnects 1026.

The first inductor 1001 includes an interconnect 1003 and an interconnect 1005. The interconnect 1003 may be a first terminal of the first inductor 1001. The interconnect 1005 may be a second terminal of the first inductor 1001. The interconnect 1003 is coupled to the plurality of interconnects 1020. The interconnect 1005 is coupled to the plurality of interconnects 1026. The plurality of interconnects 1020 and 1026 may be optional. In some implementations, the interconnect 1003 is directly coupled to the interconnect 1010. In some implementations, the interconnect 1005 is directly coupled to the interconnect 1015.

The second inductor 1002 includes a first interconnect 1051, a second interconnect 1052, a third interconnect 1053, a fourth interconnect 1054, a fifth interconnect 1055, and a sixth interconnect 1056. The first interconnect 1051 (e.g., trace), the third interconnect 1053, and the fifth interconnect 1055 are formed on a second metal layer of a substrate (e.g., substrate 202). The second interconnect 1052, the fourth interconnect 1054, and the sixth interconnect 1056 are formed in a first metal layer of a substrate (e.g., substrate 202).

The second inductor 1002 further includes a plurality of interconnects 1060, a plurality of interconnects 1061, a plurality of interconnects 1062, a plurality of interconnects 1063, a plurality of interconnects 1064, a plurality of interconnects 1065, and a plurality of interconnects 1066. A plurality of interconnects may include one or more interconnects. For example, a plurality of interconnects may include one or more pads and/or one or more vias. In some implementations, the above plurality of interconnects 1060-1066 vertically traverse a substrate (e.g., substrate 202). For example, the plurality of interconnects 1061 may collectively represent the interconnects 231-235 of FIG. 2.

As shown in FIG. 10, the plurality of interconnects 1060 is coupled (e.g., electrically coupled) to the interconnect 1051. The interconnect 1051 is coupled (e.g., electrically coupled) to the plurality of interconnects 1061. The plurality of interconnects 1061 is coupled to the interconnect 1052. The interconnect 1052 is coupled to the plurality of interconnects 1062. The plurality of interconnects 1062 is coupled to the interconnect 1053. The interconnect 1053 is coupled to the plurality of interconnects 1063. The plurality of interconnects 1063 is coupled to the interconnect 1054. The interconnect 1054 is coupled to the plurality of interconnects 1064. The plurality of interconnects 1064 is coupled to the interconnect 1055. The interconnect 1055 is coupled to the plurality of interconnects 1065. The plurality of interconnects 1065 is coupled to the interconnect 1056. The interconnect 1056 is coupled to the plurality of interconnects 1066.

The second inductor 1002 includes an interconnect 1004 and an interconnect 1006. The interconnect 1004 may be a first terminal of the second inductor 1002. The interconnect 1006 may be a second terminal of the second inductor 1002. The interconnect 1004 is coupled to the plurality of interconnects 1060. The interconnect 1006 is coupled to the plurality of interconnects 1066. The plurality of interconnects 1060 and 1066 may be optional. In some implementations, the interconnect 1004 is directly coupled to the interconnect 1051. In some implementations, the interconnect 1006 is directly coupled to the interconnect 1056.

Figure 11:
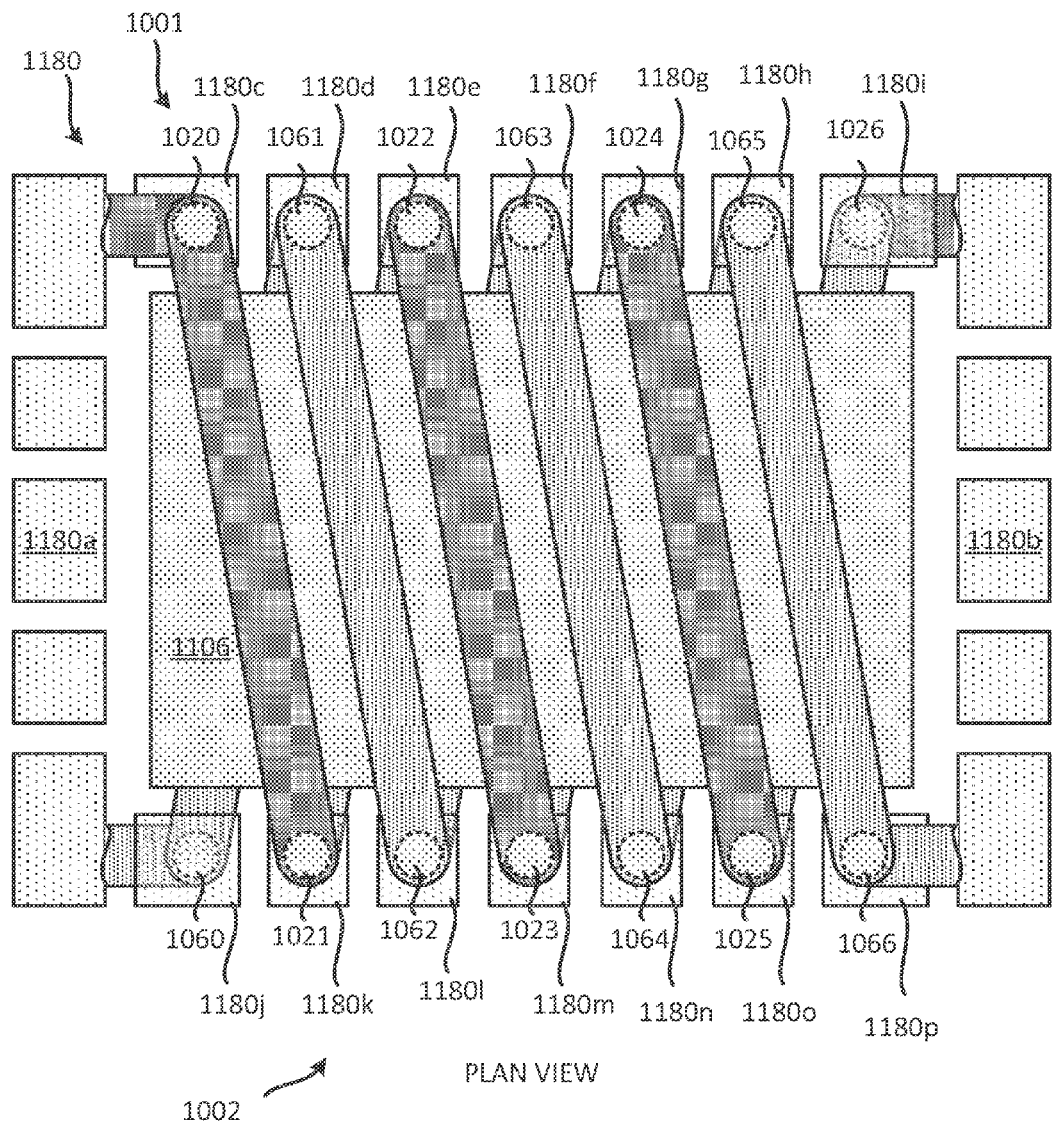
FIG. 11 illustrates a plan view (e.g., top view) of a magnetic core, coupled inductors, and a protective ring.

FIG. 11 illustrates the integration of the coupled inductor 1000 of FIG. 10 with a magnetic core 1106 and a protective ring 1180. The protective ring 1180 is a discrete protective ring. The protective ring 1180 includes several protective ring portions 1180a-p. As mentioned above the coupled inductor 1000 includes the first inductor 1001 and the second inductor 1002. The coupled inductor 1000, the magnetic core 1106 and the protective ring 1180 may be implemented in a substrate (e.g., substrate 202). However, for the purpose of clarity, the substrate, including the dielectric layers (e.g., core layer, prepeg layers) are not shown.

As shown in FIG. 11, the coupled inductor 1100 is integrated with the magnetic core 1106 such that the magnetic core 1106 is located at least partially within the windings of the coupled inductor 1100. In addition, the protective ring 1180 is integrated in the windings of the coupled inductor 1100 such that the protective ring 1180 is part of (e.g., touching) of the windings of the coupled inductor 1100. Some portions of the protective ring 1180 may be coupled (e.g., electrically coupled) to portions of the winding of the coupled inductor 1000. Thus, some portions of the protective ring 1180 may be part of the first inductor 1001 and/or the second inductor 1002. For example, the protective ring portion 1180*d* is part of the plurality of interconnects 1061. It should be noted different implementations may segment the protective ring 1180 differently with different sizes and shapes.

Only one discrete protective ring is shown, but some implementations may include more than one protective ring. For example, the protective ring 1180 (e.g., discrete protective ring) may be located on a first layer (e.g., first metal layer) of the package substrate, and another protective ring may be located on a second layer (e.g., second metal layer) of the package substrate.

Figure 12:
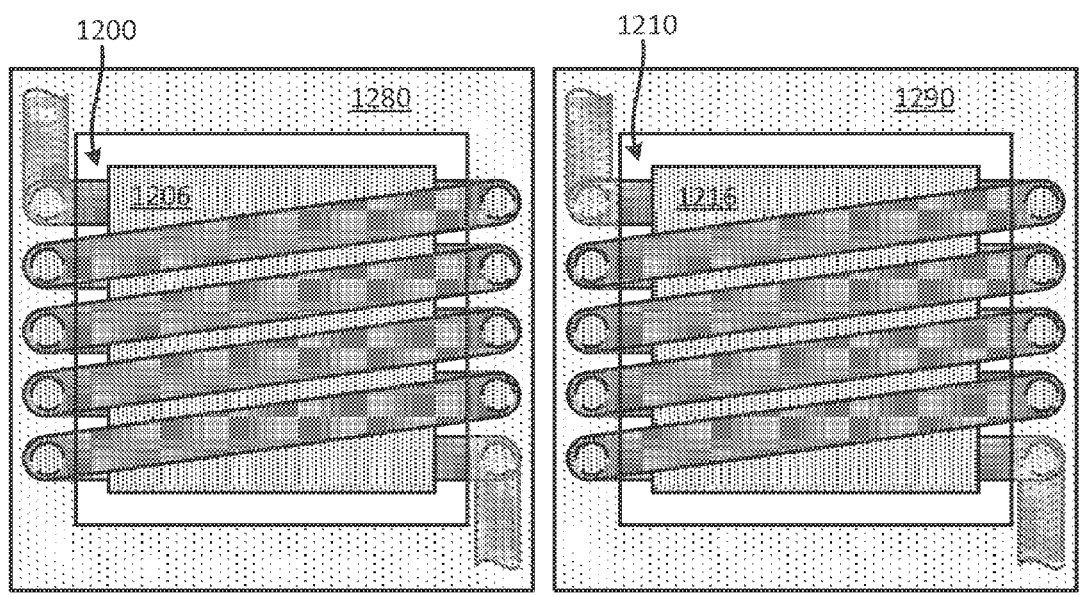
FIG. 12 illustrates a plan view (e.g., top view) of a set of magnetic cores, a set of inductors, and a set of protective rings configured to operate as a transformer.

FIG. 12 illustrates a plan view (e.g., top view) of two inductors configured to operate as a transformer. Specifically, FIG. 12 illustrates a first inductor 1200, a first magnetic core 1206, a first protective ring 1280, a second inductor 1210, a second magnetic core 1216, and a second protective ring 1290. In some implementations, the first inductor 1200, the first magnetic core 1206, the first protective ring 1280, the second inductor 1210, the second magnetic core 1216, and the second protective ring 1290 are configured to operate as a transformer.

The first inductor 1200, the first magnetic core 1206, the first protective ring 1280 may be respectively similar to the inductor 300, the magnetic core 206, and the protective ring 480 as described above in FIGS. 3-6. Similarly, the second inductor 1210, the second magnetic core 1216, and the second protective ring 1290 may be respectively similar to the inductor 300, the magnetic core 206, and the protective ring 480 as described above in FIGS. 3-6.

The first inductor 1200, the first magnetic core 1206, the first protective ring 1280, the second inductor 1210, the second magnetic core 1216, and the second protective ring 1290 may be implemented in a substrate (e.g., substrate 202) in a similar manner as described in FIG. 2 above.

FIG. 12 illustrates magnetic cores in their own respective cavities in a substrate. However, in some implementations, one cavity may include two or more magnetic cores. In some implementations, one protective ring may surround two or more magnetic cores. Moreover, in some implementations, one or more of the protective rings may be a discrete protective ring (e.g., non-contiguous protective ring).

FIG. 12 illustrates the protective rings (e.g., first protective ring 1280, second protective ring 1290) located on a first metal layer of the package substrate. In some implementations, other protective rings may be located on a different metal layer (e.g., second metal layer) of the package substrate.

Exemplary Semi-Additive Patterning (SAP) Process

Various interconnects (e.g., traces, vias, pads) are described in the present disclosure. These interconnects may be formed in the substrate, the encapsulation layer, and/or the integrated device package. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes. The processes below may be used to form for example, interconnects 230-236.

Different implementations may use different processes to form and/or fabricate the metal layers (e.g., interconnects, redistribution layer, under bump metallization layer). In some implementations, these processes include a semi-additive patterning (SAP) process and a damascene process. These various different processes are further described below.

Figure 13:
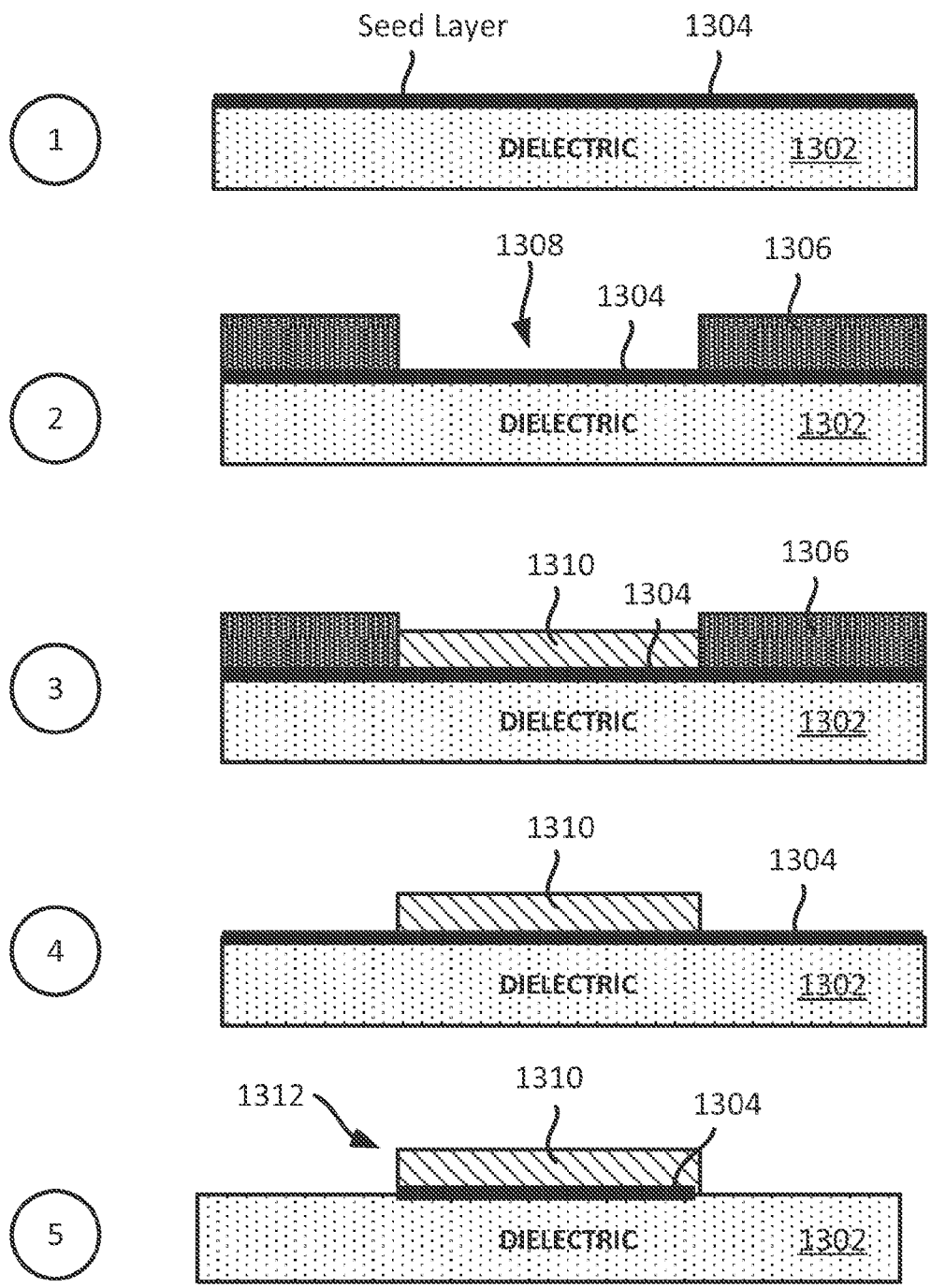
FIG. 13 illustrates an example of a semi-additive patterning (SAP) process.

FIG. 13 illustrates a sequence for forming an interconnect using a semi-additive patterning (SAP) process to provide and/or form an interconnect in one or more dielectric layer(s) and/or encapsulation layer. As shown in FIG. 13, stage 1 illustrates a state of an integrated device (e.g., substrate) after a dielectric layer 1302 is provided (e.g., formed). In some implementations, stage 1 illustrates that the dielectric layer 1302 includes a first metal layer 1304. The first metal layer 1304 is a seed layer in some implementations. In some implementations, the first metal layer 1304 may be provided (e.g., formed) on the dielectric layer 1302 after the dielectric layer 1302 is provided (e.g., received or formed). Stage 1 illustrates that the first metal layer 1304 is provided (e.g., formed) on a first surface of the dielectric layer 1302. In some implementations, the first metal layer 1304 is provided by using a deposition process (e.g., PVD, CVD, plating process).

Stage 2 illustrates a state of the integrated device after a photo resist layer 1306 (e.g., photo develop resist layer) is selectively provided (e.g., formed) on the first metal layer 1304. In some implementations, selectively providing the photo resist layer 1306 includes providing a photo resist layer 1306 on the first metal layer 1304 and selectively removing portions of the photo resist layer 1306 by developing (e.g., using a development process). Stage 2 illustrates that the photo resist layer 1306 is provided such that a cavity 1308 is formed.

Stage 3 illustrates a state of the integrated device after a second metal layer 1310 is formed in the cavity 1308. In some implementations, the second metal layer 1310 is formed over an exposed portion of the first metal layer 1304. In some implementations, the second metal layer 1310 is provided by using a deposition process (e.g., plating process).

Stage 4 illustrates a state of the integrated device after the photo resist layer 1306 is removed. Different implementations may use different processes for removing the photo resist layer 1306.

Stage 5 illustrates a state of the integrated device after portions of the first metal layer 1304 are selectively removed. In some implementations, one or more portions of the first metal layer 1304 that is not covered by the second metal layer 1310 is removed. As shown in stage 5, the remaining first metal layer 1304 and the second metal layer 1310 may form and/or define an interconnect 1312 (e.g., trace, vias, pads) in an integrated device and/or a substrate. In some implementations, the first metal layer 1304 is removed such that a dimension (e.g., length, width) of the first metal layer 1304 underneath the second metal layer 1310 is about the same or smaller than a dimension (e.g., length, width) of the second metal layer 1310, which can result in an undercut, as shown at stage 5 of FIG. 13. In some implementations, the above mentioned processes may be iterated several times to provide and/or form several interconnects in one or more dielectric layers of an integrated device and/or substrate.

Exemplary Damascene Process

Figure 14:
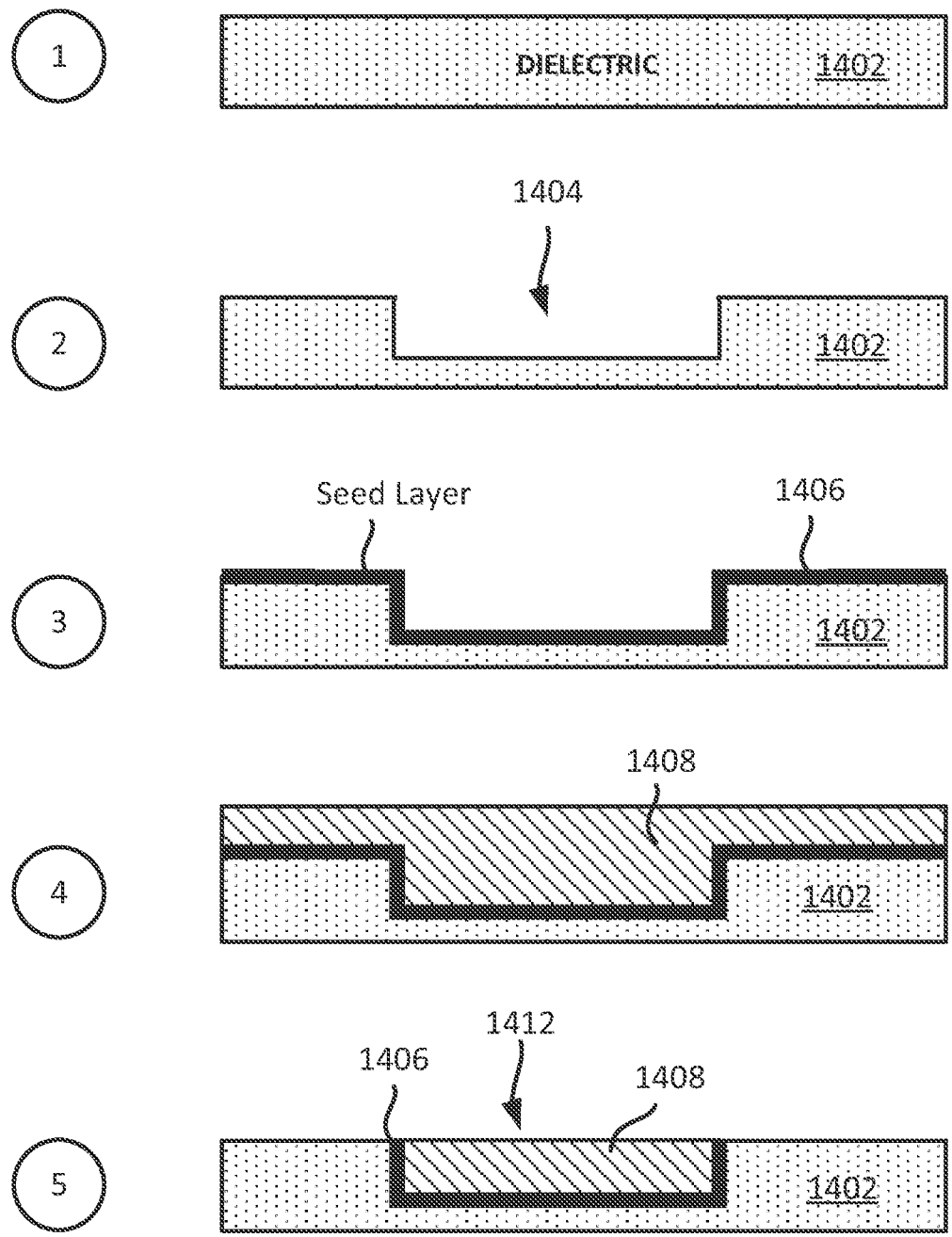
FIG. 14 illustrates an example of a damascene process.

FIG. 14 illustrates a sequence for forming an interconnect using a damascene process to provide and/or form an interconnect in a dielectric layer and/or an encapsulation layer. As shown in FIG. 14, stage 1 illustrates a state of an integrated device after a dielectric layer 1402 is provided (e.g., formed). In some implementations, the dielectric layer 1402 is an inorganic layer (e.g., inorganic film).

Stage 2 illustrates a state of an integrated device after a cavity 1404 is formed in the dielectric layer 1402. Different implementations may use different processes for providing the cavity 1404 in the dielectric layer 1402.

Stage 3 illustrates a state of an integrated device after a first metal layer 1406 is provided on the dielectric layer 1402. As shown in stage 3, the first metal layer 1406 provided on a first surface of the dielectric layer 1402. The first metal layer 1406 is provided on the dielectric layer 1402 such that the first metal layer 1406 takes the contour of the dielectric layer 1402 including the contour of the cavity 1404. The first metal layer 1406 is a seed layer in some implementations. In some implementations, the first metal layer 1406 is provided by using a deposition process (e.g., physical vapor deposition (PVD), Chemical Vapor Deposition (CVD) or plating process).

Stage 4 illustrates a state of the integrated device after a second metal layer 1408 is formed in the cavity 1404 and a surface of the dielectric layer 1402. In some implementations, the second metal layer 1408 is formed over an exposed portion of the first metal layer 1406. In some implementations, the second metal layer 1408 is provided by using a deposition process (e.g., plating process).

Stage 5 illustrates a state of the integrated device after the portions of the second metal layer 1408 and portions of the first metal layer 1406 are removed. Different implementations may use different processes for removing the second metal layer 1408 and the first metal layer 1406. In some implementations, a chemical mechanical planarization (CMP) process is used to remove portions of the second metal layer 1408 and portions of the first metal layer 1406. As shown in stage 5, the remaining first metal layer 1406 and the second metal layer 1408 may form and/or define an interconnect 1412 (e.g., trace, vias, pads) in an integrated device and/or a substrate. As shown in stage 5, the interconnect 1412 is formed in such a way that the first metal layer 1406 is formed on the base portion and the side portion(s) of the second metal layer 1410. In some implementations, the cavity 1404 may include a combination of trenches and/or holes in two levels of dielectrics so that via and interconnects (e.g., metal traces) may be formed in a single deposition process, In some implementations, the above mentioned processes may be iterated several times to provide and/or form several interconnects in one or more dielectric layers of an integrated device and/or substrate.

Exemplary Electronic Devices

Figure 15:
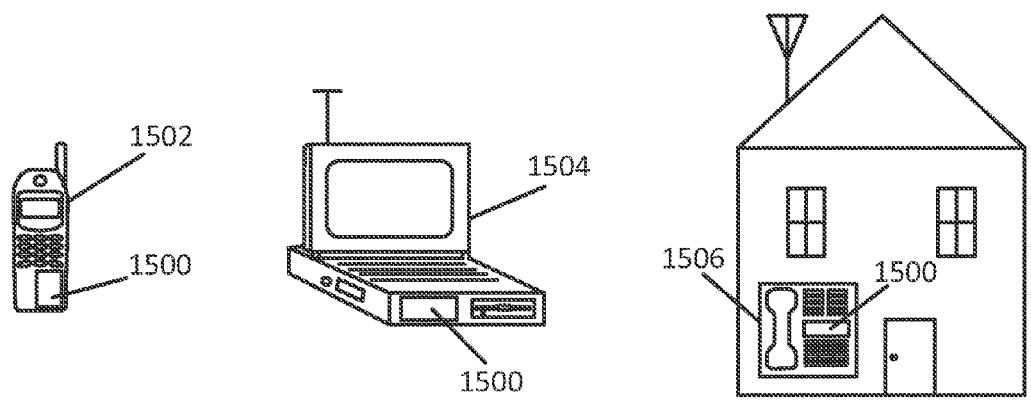
FIG. 15 illustrates various electronic devices that may integrate an integrated device package, a semiconductor device, a die, an integrated circuit and/or PCB described herein.

FIG. 15 illustrates various electronic devices that may be integrated with any of the aforementioned integrated device, semiconductor device, integrated circuit, die, interposer, package or package-on-package (PoP). For example, a mobile phone device 1502, a laptop computer device 1504, and a fixed location terminal device 1506 may include an integrated device 1500 as described herein. The integrated device 1500 may be, for example, any of the integrated circuits, dies, integrated devices, integrated device packages, integrated circuit devices, device packages, integrated device packages, package-on-package devices described herein. The devices 1502, 1504, 1506 illustrated in FIG. 15 are merely exemplary. Other electronic devices may also feature the integrated device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, features, and/or functions illustrated in FIGS. 2, 3, 4, 5, 6, 7, 8A-8C, 9, 10, 11, 12, 13, 14 and/or 15 may be rearranged and/or combined into a single component, feature or function or embodied in several components, or functions. Additional elements, components, and/or functions may also be added without departing from the disclosure. It should also be noted that FIGS. 2, 3, 4, 5, 6, 7, 8A-8C, 9, 10, 11, 12, 13, 14 and/or 15 and its corresponding description in the present disclosure is not limited to dies and/or ICs. In some implementations, FIGS. 2, 3, 4, 5, 6, 7, 8A-8C, 9, 10, 11, 12, 13, 14 and/or 15 and its corresponding description may be used to manufacture, create, provide, and/or produce integrated devices. In some implementations, a device may include a die, a die package, an integrated device, an integrated device, an integrated device package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. An integrated device package comprising:
a die; and
a package substrate coupled to the die, the package substrate comprising:
at least one dielectric layer;
a magnetic core in the at least one dielectric layer;
a first protective ring; and a first inductor comprising a plurality of first interconnects, the first inductor positioned in the package substrate to at least partially surround the magnetic core, wherein the first protective ring comprises at least one interconnect from the plurality of first interconnects of the first inductor.

2. The integrated device package of claim 1, wherein the first protective ring comprises a non-contiguous protective ring.

3. The integrated device package of claim 1, wherein the first protective ring comprises a contiguous protective ring.

4. The integrated device package of claim 1, wherein the package substrate further comprises a second protective ring comprising at least one second interconnect from the plurality of first interconnects of the first inductor.

5. The integrated device package of claim 4, wherein the first protective ring is located on a first metal layer of the package substrate and the second protective ring is located on a second metal layer of the package substrate.

6. The integrated device package of claim 4, wherein the first protective ring comprises a first contiguous protective ring or a first non-contiguous protective ring, and the second protective ring comprises a second contiguous protective ring or a second non-contiguous protective ring.

7. The integrated device package of claim 1, wherein the package substrate further comprises a second inductor comprising a plurality of second interconnects.

8. The integrated device package of claim 7, wherein the first inductor and the second inductor are configured to operate as a coupled inductor.

9. The integrated device package of claim 7, wherein the first inductor and the second inductor are configured to operate as a transformer.

10. The integrated device package of claim 7, wherein the second inductor is positioned in the package substrate to at least partially surround the magnetic core, wherein the first protective ring comprises at least one interconnect from the plurality of second interconnects of the second inductor.

11. The integrated device package of claim 1, wherein the at least one interconnect from the plurality of first interconnects that is part of the first protective ring, is configured to reduce eddy currents and provide improved shielding for the first inductor.

12. The integrated device package of claim 1, wherein the first inductor comprises a solenoid inductor.

13. The integrated device package of claim 1, wherein the first protective ring at least partially surrounds the magnetic core.

14. The integrated device package of claim 1, wherein a spacing between the magnetic core and the first inductor is about 50 microns ($\mu$m) or less.

15. The integrated device package of claim 1, wherein a spacing between the magnetic core and the first protective ring is about 50 microns ($\mu$m) or less.

16. The integrated device package of claim 1, wherein the magnetic core includes a carrier, a first magnetic layer, and a second magnetic layer.

17. The integrated device package of claim 1, wherein the plurality of first interconnects comprises a trace, a via, and/or a pad.

18. The integrated device package of claim 1, wherein the integrated device package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in a automotive vehicle, and further including the device.

19. A method for fabricating an integrated device package, comprising:
forming a package substrate, wherein forming the package substrate comprises:
forming at least one dielectric layer;
providing a magnetic core in the at least one dielectric layer;
forming a first metal layer to define a first protective ring in the package substrate; and
forming a plurality of first interconnects to define a first inductor in the package substrate, wherein forming the plurality of first interconnects comprises:
forming the plurality of first interconnects in the package substrate such that the plurality of first interconnects at least partially surrounds the magnetic core, and
using at least a portion of the first metal layer, to form an interconnect from the plurality of first interconnects, to define the first inductor; and
coupling the package substrate to a die.

20. The method of claim 19, wherein forming the first metal layer to define the first protective ring in the package substrate comprises forming the first metal layer to define a non-contiguous protective ring in the package substrate.

21. The method of claim 19, wherein forming the first metal layer to define the first protective ring in the package substrate comprises forming the first metal layer to define a contiguous protective ring in the package substrate.

22. The method of claim 19, wherein forming the package substrate further comprises forming a second metal layer to define a second protective ring in the package substrate such that the second protective ring comprises at least one second interconnect from the plurality of first interconnects.

23. The method of claim 22, wherein forming the first metal layer to define the first protective ring comprises forming a plurality of second interconnects, and wherein forming the second metal layer to define the second protective ring comprises forming a plurality of third interconnects.

24. The method of claim 19, wherein forming a package substrate further comprises forming a plurality of second interconnects to define a second inductor in the package substrate, wherein forming the plurality of second interconnects comprises:
forming the plurality of second interconnects in the package substrate such that the plurality of second interconnects at least partially surround the magnetic core; and
using at least a second portion of the first metal layer to form at least one interconnect from the plurality of second interconnects, to define the second inductor.

25. The method of claim 19, wherein the first inductor comprises a solenoid inductor.

26. The method of claim 19, wherein forming the at least one dielectric layer comprises:
forming a first dielectric layer, wherein the first dielectric layer is a core layer; and
forming a second dielectric layer.

27. The method of claim 19, wherein a spacing between the magnetic core and the first inductor is about 50 microns ($\mu$m) or less.

28. The method of claim 19, wherein a spacing between the magnetic core and the first protective ring is about 50 microns ($\mu$m) or less.

29. The method of claim 19, wherein providing the magnetic core in the dielectric layer comprises providing a carrier, a first magnetic layer, and a second magnetic layer.

30. The method of claim 19, wherein the integrated device package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in a automotive vehicle, and further including the device.

* * * * *